US009022591B2

(12) United States Patent
Fukuda et al.

(10) Patent No.: US 9,022,591 B2
(45) Date of Patent: May 5, 2015

(54) LUMINESCENT MATERIAL

(71) Applicant: Kabushiki Kaisha Toshiba, Tokyo (JP)

(72) Inventors: Yumi Fukuda, Tokyo (JP); Masahiro Kato, Naka-gun (JP); Naotoshi Matsuda, Chigasaki (JP); Keiko Albessard, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 242 days.

(21) Appl. No.: 13/837,836

(22) Filed: Mar. 15, 2013

(65) Prior Publication Data

US 2014/0092600 A1    Apr. 3, 2014

(30) Foreign Application Priority Data

Jun. 13, 2012  (JP) ................. 2012-133861
Feb. 22, 2013  (JP) ................. 2013-033690

(51) Int. Cl.
| | |
|---|---|
| *C09K 11/77* | (2006.01) |
| *C09K 11/08* | (2006.01) |
| *F21K 99/00* | (2010.01) |
| *H01L 33/50* | (2010.01) |
| *H01L 33/64* | (2010.01) |

(52) U.S. Cl.
CPC ......... *C09K 11/7728* (2013.01); *C09K 11/0883* (2013.01); *C09K 11/7734* (2013.01); *F21K 9/56* (2013.01); *H01L 33/502* (2013.01); *H01L 33/504* (2013.01); *H01L 33/507* (2013.01); *H01L 33/641* (2013.01)

(58) Field of Classification Search
USPC .......................................................... 362/84
See application file for complete search history.

(56) References Cited

U.S. PATENT DOCUMENTS

| | | | |
|---|---|---|---|
| 2010/0025632 A1 | 2/2010 | Fukuda et al. | |
| 2010/0102707 A1* | 4/2010 | Fukuda et al. | 313/503 |
| 2012/0056528 A1* | 3/2012 | Kato et al. | 313/503 |
| 2012/0062106 A1* | 3/2012 | Okada et al. | 313/503 |
| 2012/0230010 A1 | 9/2012 | Kato et al. | |
| 2013/0050980 A1 | 2/2013 | Kato et al. | |

FOREIGN PATENT DOCUMENTS

| | | |
|---|---|---|
| EP | 2 426 187 A2 | 3/2012 |
| EP | 2 426 187 A3 | 3/2012 |
| JP | 2009-286995 | 12/2009 |
| JP | 2010-129906 | 6/2010 |

OTHER PUBLICATIONS

Extended Search Report issued Jul. 15, 2013 in European Patent Application No. 13160043.9.

* cited by examiner

*Primary Examiner* — Laura Tso
(74) *Attorney, Agent, or Firm* — Oblon, McClelland, Maier & Neustadt, L.L.P.

(57) ABSTRACT

According to one embodiment, the luminescent material exhibits a luminescence peak in a wavelength ranging from 490 to 580 nm when excited with light having an emission peak in a wavelength ranging from 250 to 500 nm. The luminescent material has a diffraction peak intensity of the largest peak detected at $2\theta=30.1\text{-}31.1°$ that is higher than the diffraction peak intensity of the peak detected at $2\theta=25.0\text{-}26.0°$ in X-ray diffraction by the Bragg-Brendano method using Cu-K$\alpha$ line and its composition is represented by $(Sr_{1-x}Eu_x)_{3-y}Al_{3+z}Si_{13-z}O_{2+u}N_{21-w}$ (a part of the Sr may be substituted by at least one selected from Ba, Ca, Mg and Na, $0<x\leq1$, $-0.1\leq y\leq0.3$, $-3\leq z\leq-0.52$, and $-1.5\leq u\leq-0.3$, $-3<u-w\leq1$).

20 Claims, 17 Drawing Sheets

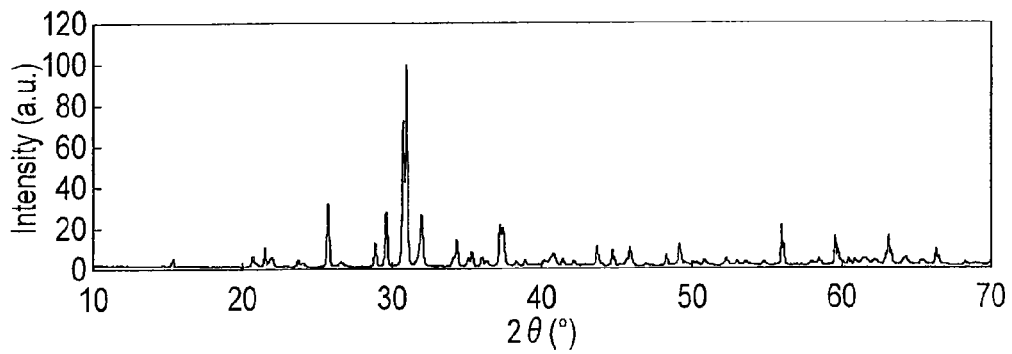
F I G. 7
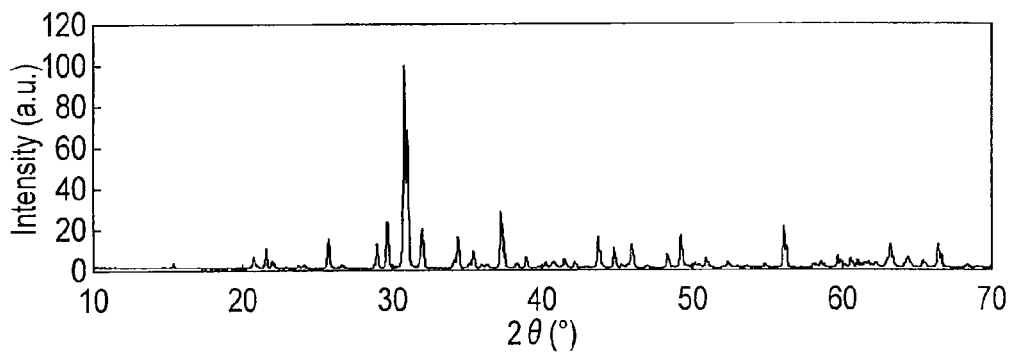
F I G. 8
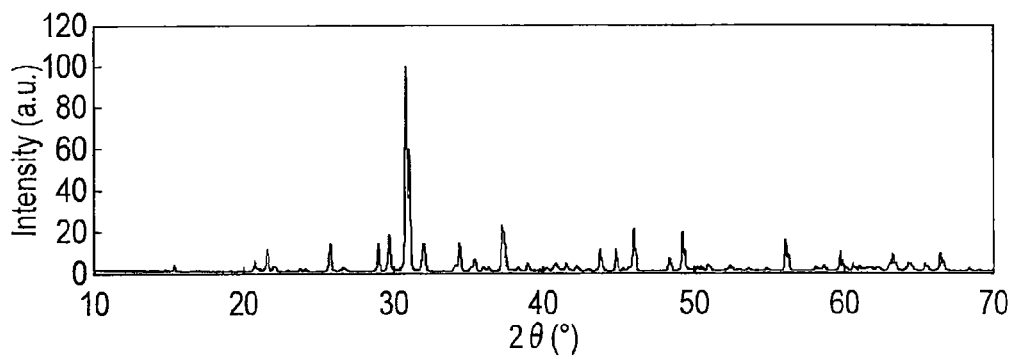
F I G. 9

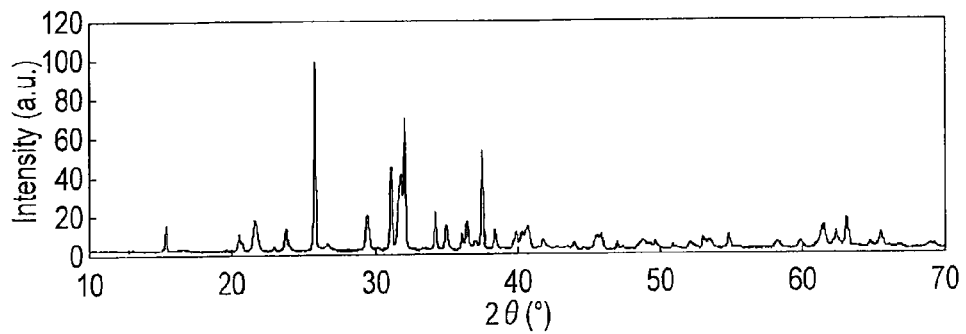
F I G. 13
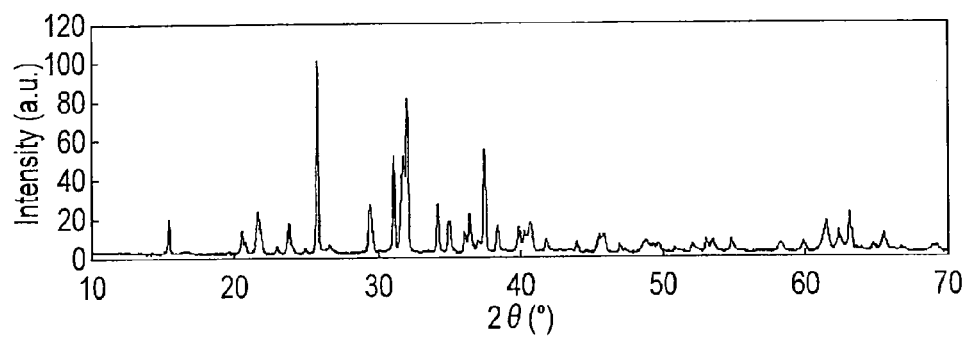
F I G. 14
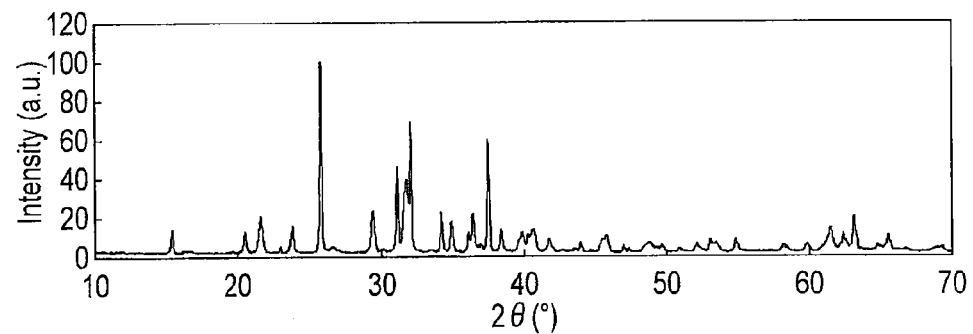
F I G. 15

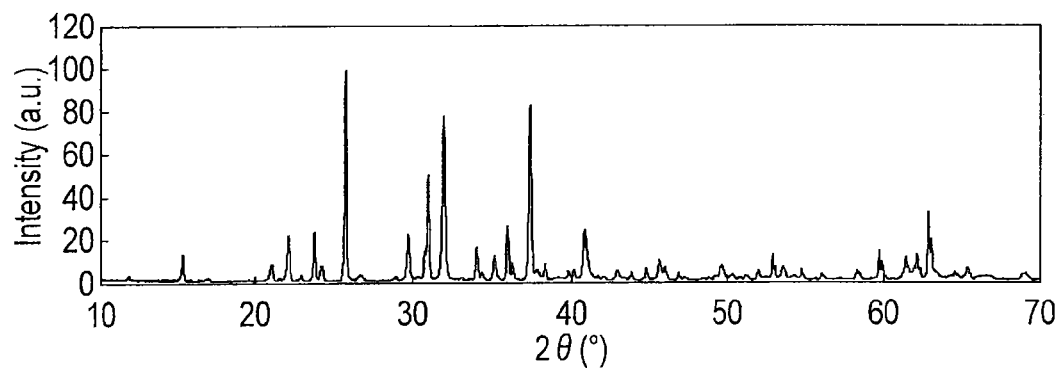
F I G. 16
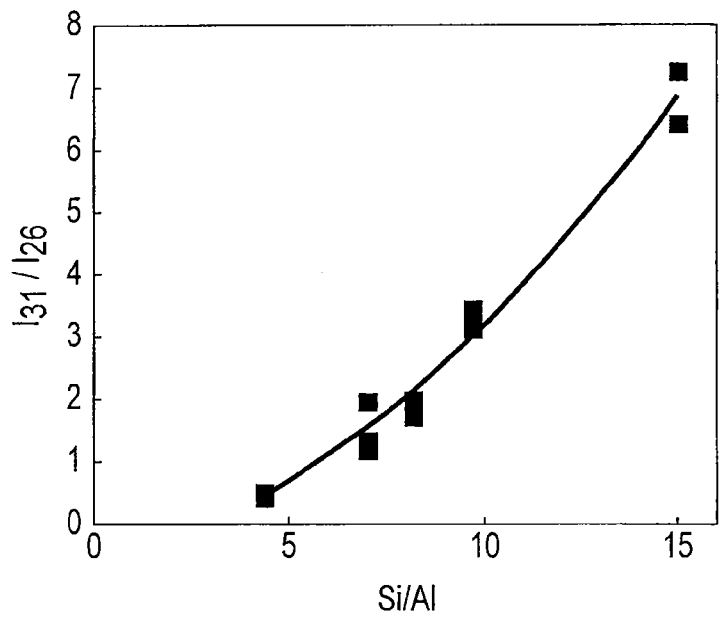
F I G. 17

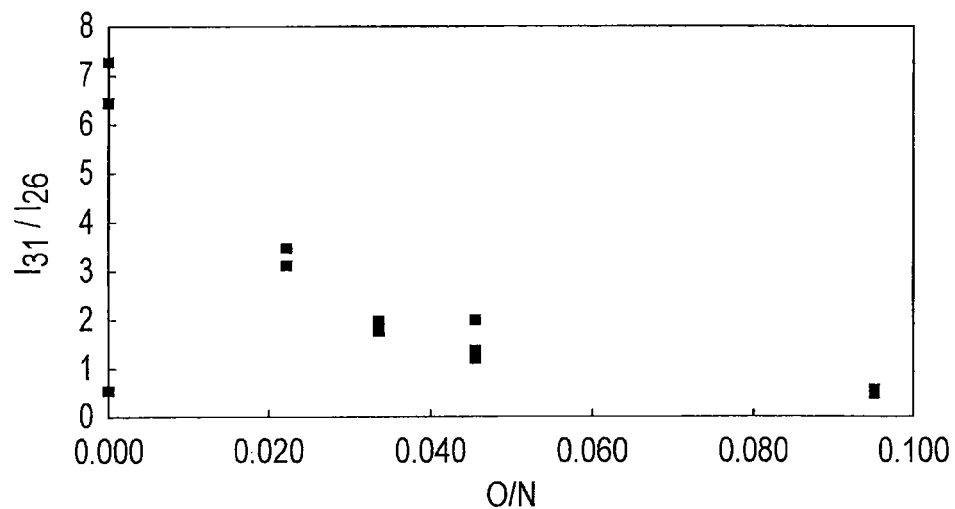
F I G. 18
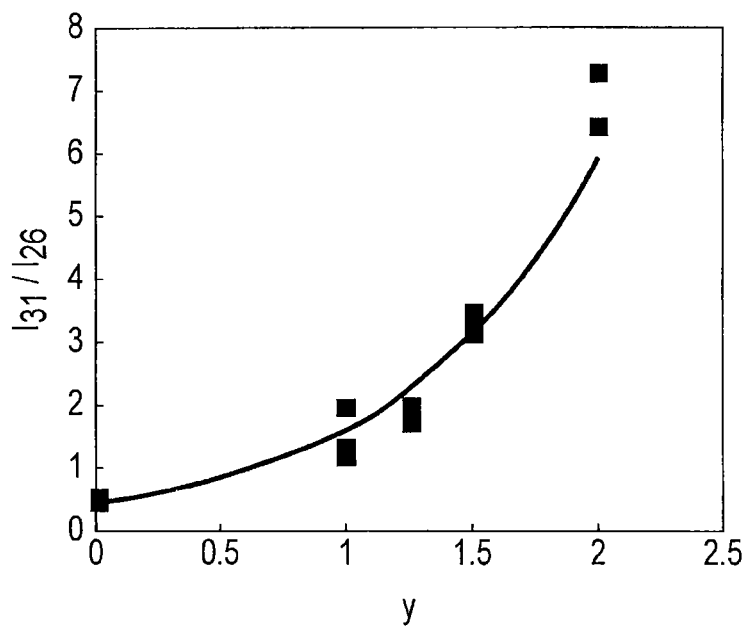
F I G. 19

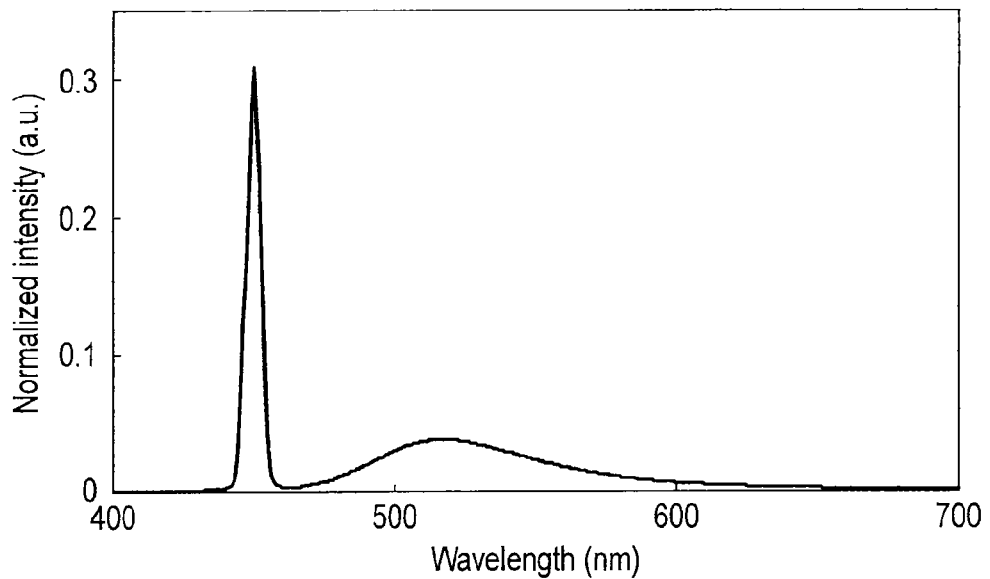
F I G. 22
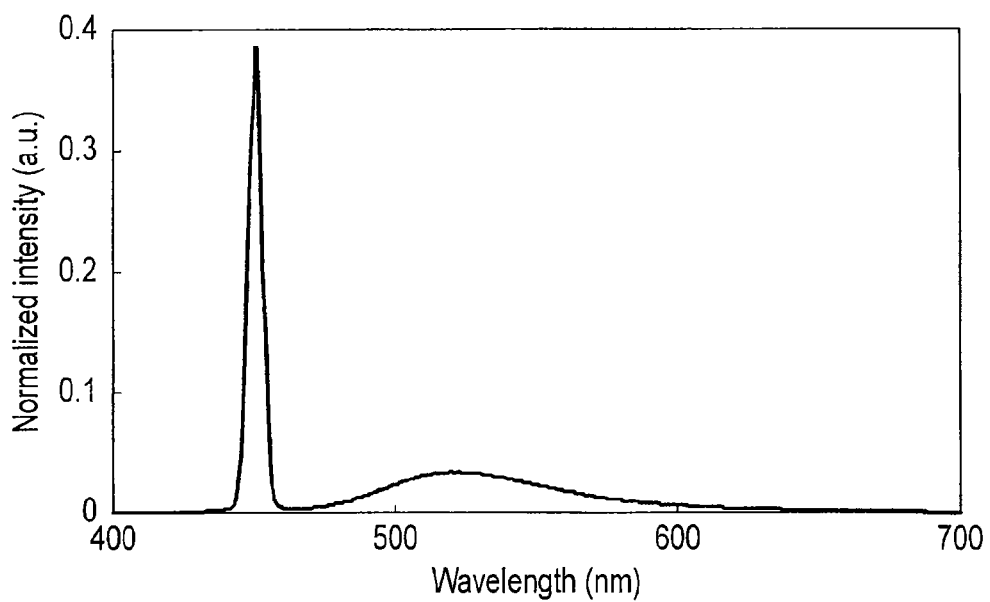
F I G. 23

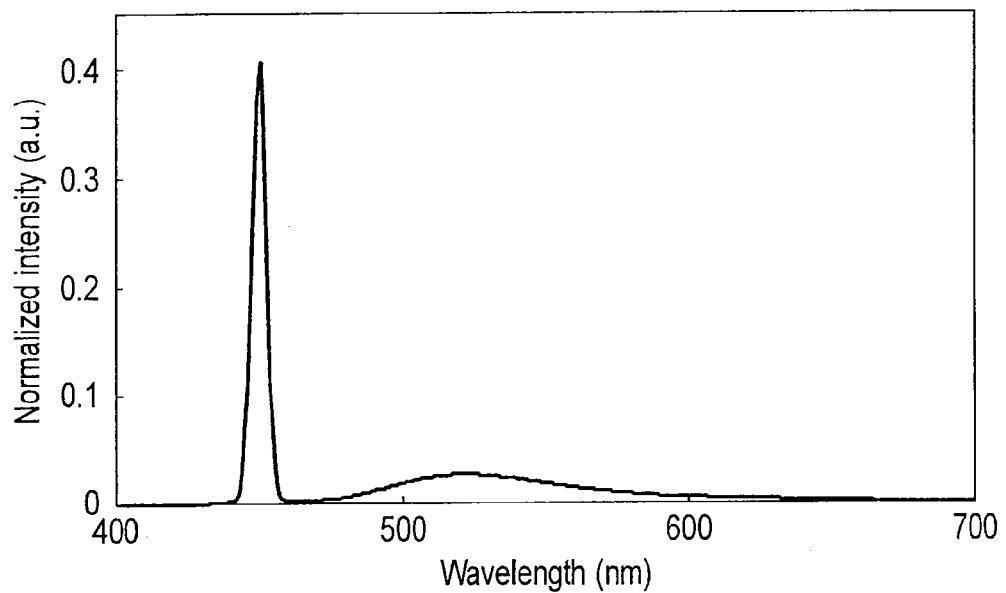
F I G. 24
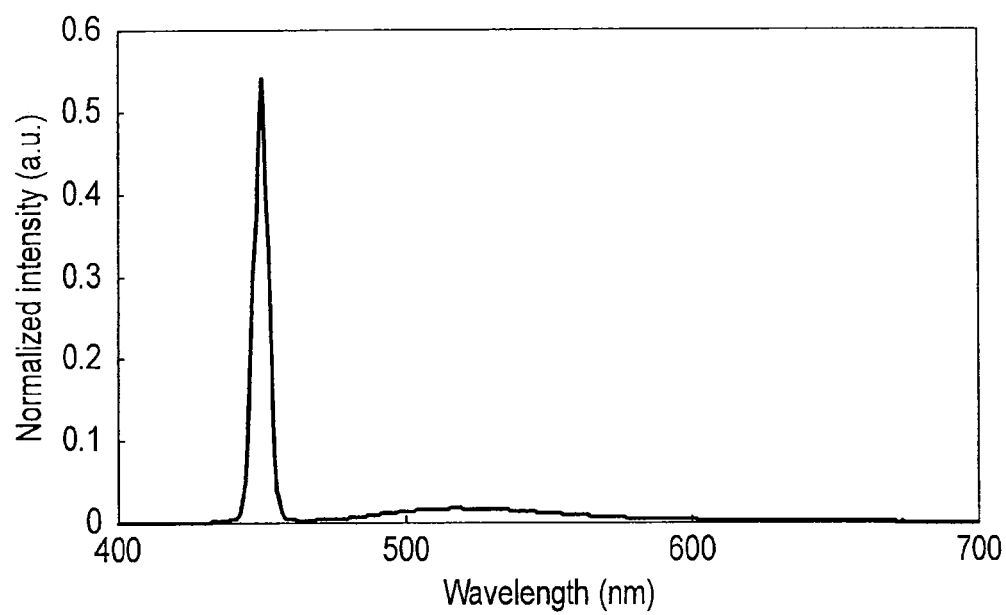
F I G. 25

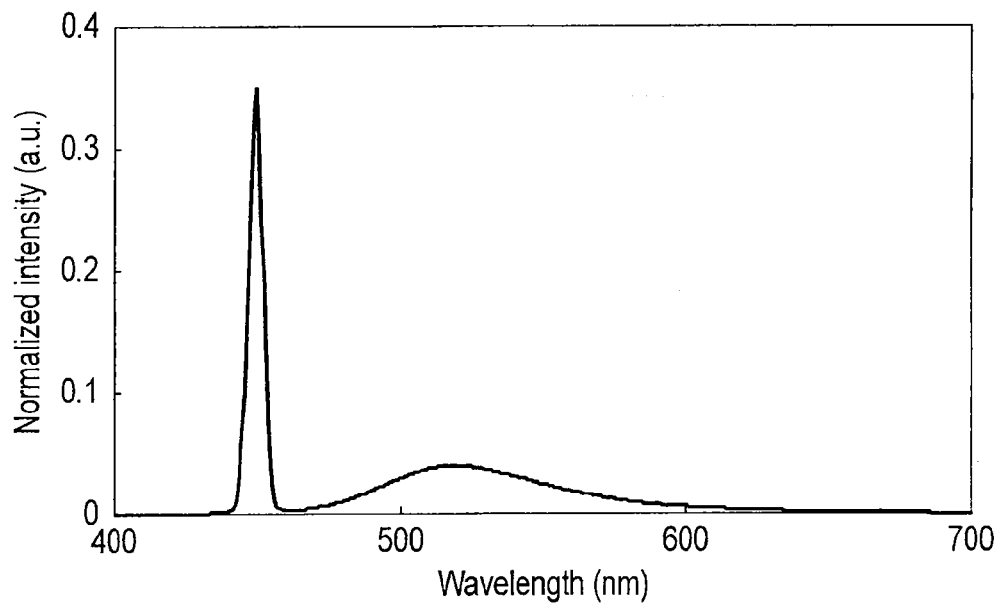
F I G. 26
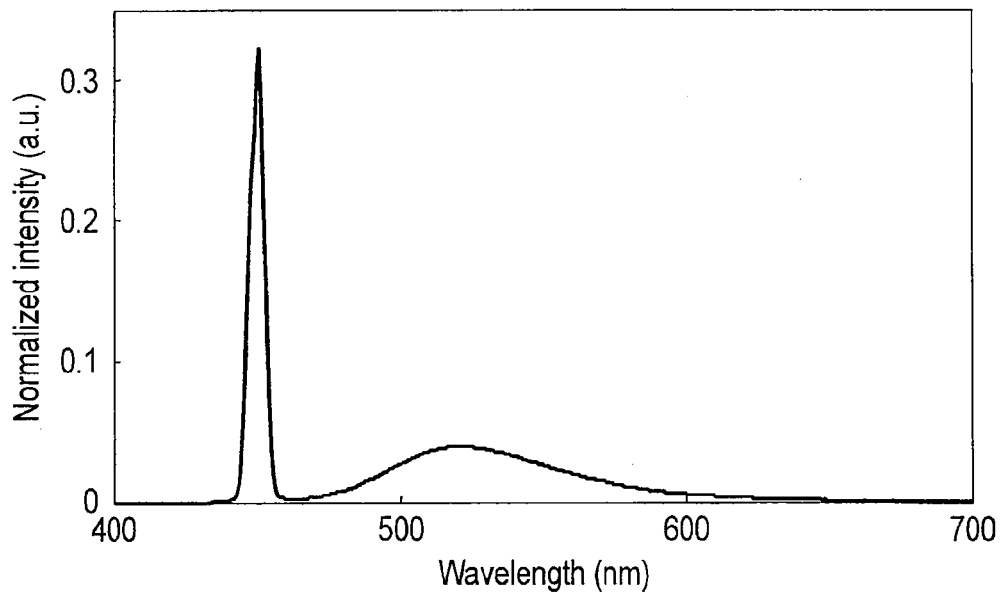
F I G. 27

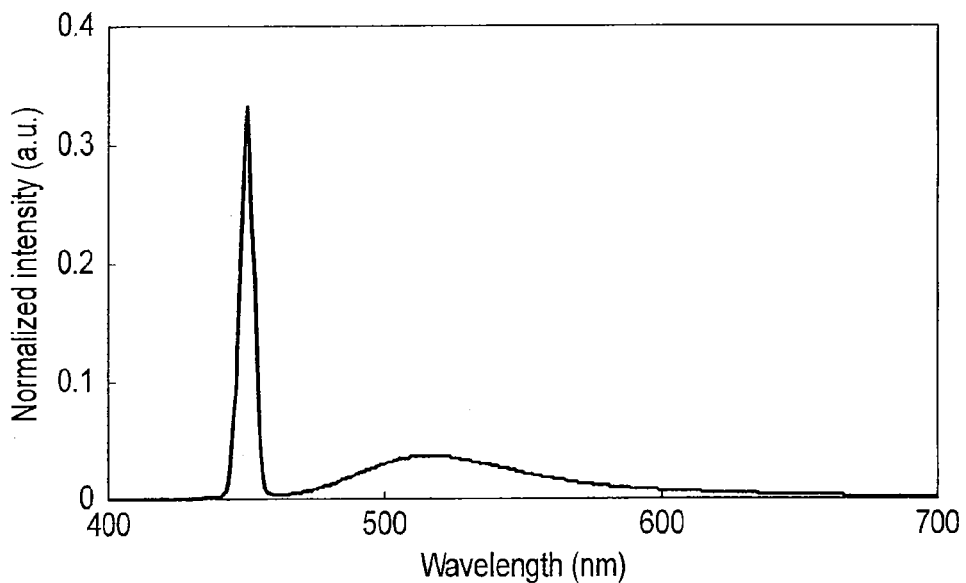
F I G. 30
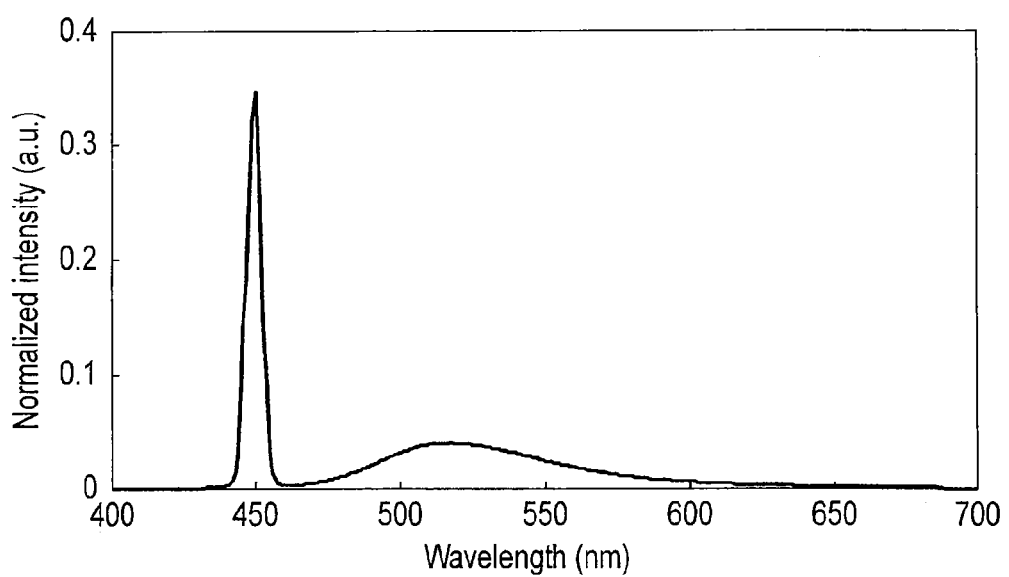
F I G. 31

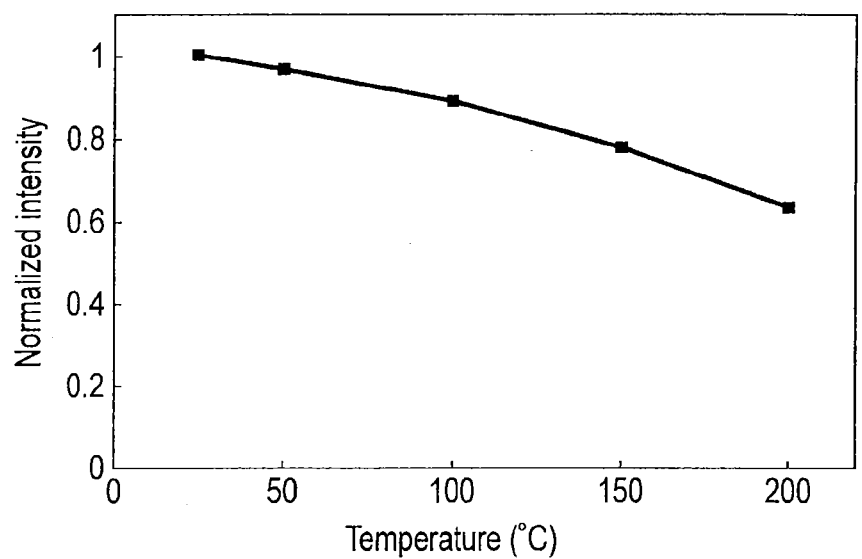
F I G. 38
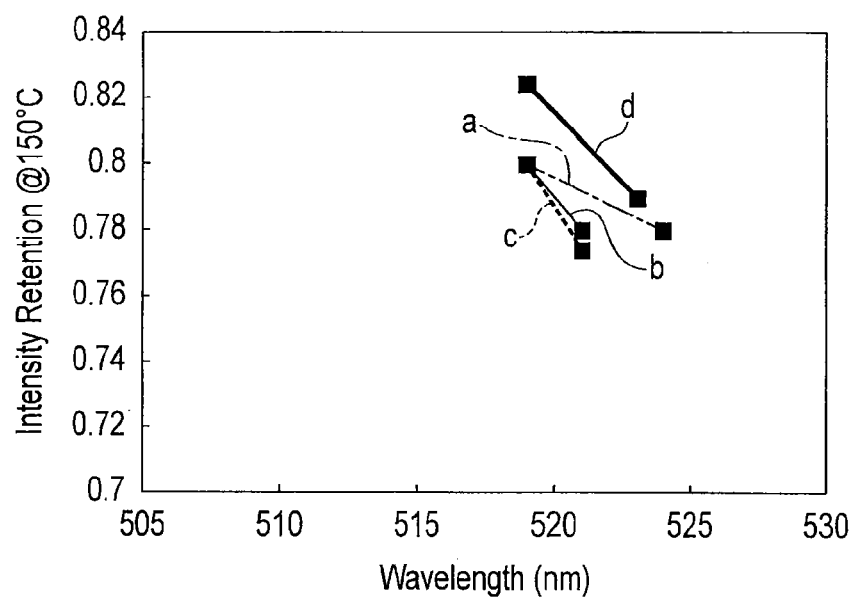
F I G. 39

US 9,022,591 B2

LUMINESCENT MATERIAL

CROSS-REFERENCE TO RELATED APPLICATIONS

This application is based upon and claims the benefit of priority from Japanese Patent Applications No. 2012-133861, filed Jun. 13, 2012; and No. 2013-033690, filed Feb. 22, 2013, the entire contents of all of which are incorporated herein by reference.

FIELD

Embodiments described herein generally relate to a luminescent material and a light-emitting device using the same.

BACKGROUND

As a luminescent material that emits green light by the excitation of blue light (green-emitting luminescent material), an Eu-activated alkaline earth orthosilicate luminescent material has been recently suggested. Such a green-emitting luminescent material, a luminescent material that emits red light by the excitation of blue light (red-emitting luminescent material), and a blue LED are combined to constitute a white light-emitting device. The blue LED is driven to generate heat, and thereby to increase the temperature of the luminescent material. When the temperature is increased, the emission intensity of the luminescent material is generally reduced.

There is a high demand for the luminous efficiency and temperature characteristics of the luminescent material.

BRIEF DESCRIPTION OF THE DRAWINGS

FIG. 7 shows an XRD pattern of the luminescent material of Example;

FIG. 8 shows an XRD pattern of the luminescent material of Example;

FIG. 9 shows an XRD pattern of the luminescent material of Example;

FIG. 13 shows an XRD pattern of the luminescent material of Comparative Example;

FIG. 14 shows an XRD pattern of the luminescent material of Comparative Example;

FIG. 15 shows an XRD pattern of the luminescent material of Comparative Example;

FIG. 16 shows an XRD pattern of the luminescent material of Comparative Example;

FIG. 17 is a view showing a relationship between the Si/Al ratio of the luminescent material and the peak intensity ratio $(I_{31}/I_{26})$;

FIG. 18 is a view showing a relationship between the O/N ratio of the luminescent material and the peak intensity ratio $(I_{31}/I_{26})$;

FIG. 19 is a view showing a relationship between the composition of the luminescent material and the peak intensity ratio $(I_{31}/I_{26})$;

FIG. 22 is a luminescence emission spectrum of a luminescent material of Example;

FIG. 23 is a luminescence emission spectrum of a luminescent material of Example;

FIG. 24 is a luminescence emission spectrum of a luminescent material of Example;

FIG. 25 is a luminescence emission spectrum of a luminescent material of Example;

FIG. 26 is a luminescence emission spectrum of a luminescent material of Example;

FIG. 27 is a luminescence emission spectrum of a luminescent material of Example;

FIG. 30 is a luminescence emission spectrum of a luminescent material of Comparative Example;

FIG. 31 is a luminescence emission spectrum of a luminescent material of Comparative Example;

FIG. 38 is a view showing temperature characteristics of the luminescent material of Example; and FIG. 39 is a view showing relationship between the luminescence peak wavelength and the intensity retention.

DETAILED DESCRIPTION

Figure 1:
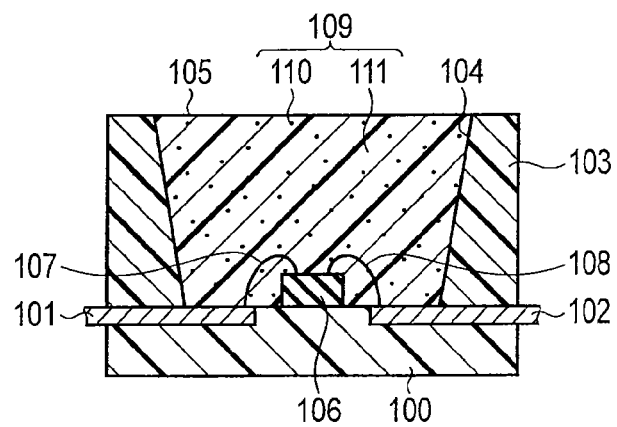
FIG. 1 is a schematic view showing the configuration of a light-emitting device according to one embodiment.

According to one embodiment, a luminescent material exhibits an luminescence peak in a wavelength ranging from 490 to 580 nm when excited with light having an emission peak in a wavelength ranging from 250 to 500 nm and thus it is a green-emitting luminescent material. The luminescent material includes a host material having a crystal structure substantially the same as that of $Sr_3Si_{13}Al_3O_2N_{21}$ and the host material is activated by Eu. The green-emitting luminescent material according to this embodiment has the composition represented by Formula 1 below.

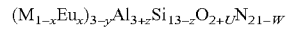

Formula 1

(wherein M represents Sr and a part of the Sr may be substituted by at least one selected from Ba, Ca, Mg, and Na. x, y, z, u, and u–w respectively satisfy the following conditions:

$0<x\leq 1$; $-0.1\leq y\leq 0.3$; $-3\leq z\leq -0.52$
$-1.5\leq u\leq -0.3$; and $-3<u-w\leq 1$)

The luminescent material has a diffraction peak intensity ($I_{31}$) of the largest peak detected at 2θ=30.1-31.1° that is higher than the diffraction peak intensity ($I_{26}$) of the peak detected at 2θ=25.0-26.0° in X-ray diffraction by the Bragg-Brendano method using Cu-Kα line.

As shown in Formula 1 above, a luminescence center element Eu substitutes at least a part of the M. M represents Sr and a part of the Sr may be substituted by at least one selected from Ba, Ca, Mg, and Na. Even if at least one selected from Ba, Ca, Mg, and Na is contained at a concentration of 15 at. % or less, more desirably 10 at. % or less based on the total amount of M, generation of a heterophase is not facilitated.

When at least 0.1 mol % of M is substituted by Eu, a sufficient luminous efficiency can be obtained. The total amount of M may be substituted by Eu (x=1). When x is less than 0.5, the reduction in luminous probability (concentration quenching) can be suppressed as much as possible. Therefore, x is preferably from 0.001 to 0.5. When the luminescence center element Eu is contained, the luminescent material of this embodiment exhibits a green emission, namely, an emission having a peak in a wavelength ranging from 490 to 580 nm when excited with light having a peak in a wavelength ranging from 250 to 500 nm. In this regard, other elements such as an inevitable impurity are contained at an amount of 100 at. % or less, more desirably 50 at. % or less based on the total amount of Eu, desired characteristics are not impaired. Examples thereof include Tb, Eu, and Mn.

When y is less than −0.1, the crystal structure of $Sr_3Si_{13}Al_3O_2N_{21}$ cannot be maintained. On the other hand, when y exceeds 0.3, Sr defects become too great, which results in a decrease in luminous efficiency. y is preferably from 0 to 0.25.

When z is less than −3, the crystal structure of $Sr_3Si_{13}Al_3O_2N_{21}$ cannot be maintained. On the other hand, when z exceeds −0.52, the luminous efficiency is decreased. z is preferably from −2 to −0.52.

When u is less than −1.5, synthesis becomes difficult. On the other hand, when u exceeds −0.3, the amount of a heterophase produced is increased. u is preferably from −1 to −0.3.

When (u−w) is less than −3, the crystal structure of $Sr_3Si_{13}Al_3O_2N_{21}$ cannot be maintained. On the other hand, when (u−w) exceeds 1, the crystal structure of $Sr_3Si_{13}Al_3O_2N_{21}$ cannot be maintained. (u−w) is preferably from −2 to 0.

The luminescent material which satisfies the conditions of the composition according to this embodiment can emit green light in a wavelength ranging from 490 to 580 nm with high efficiency when excited with light having an emission peak in a wavelength ranging from 250 to 500 nm. Additionally, the luminescent material of this embodiment has a diffraction peak intensity ($I_{31}$) of the largest peak detected at 2θ=30.1-31.1° that is higher than the diffraction peak intensity ($I_{26}$) of the peak detected at 2θ=25.0-26.0° in X-ray diffraction by the Bragg-Brendano method using Cu-Kα line. The green-emitting luminescent material satisfying all the conditions according to this embodiment has good temperature characteristics.

The green-emitting luminescent material of this embodiment is a material obtained by using an $Sr_3Al_3Si_{13}O_2N_{21}$ group crystal as a base material to substitute Sr, Si, Al, O or N which are constituent elements of the crystal with other elements or dissolving other metallic elements such as Eu in the crystal. Although the crystal structure may be slightly changed by the substitution or the like, the position of atoms is hardly changed to the extent that a chemical bond between skeletal atoms is cleaved. The atom position is given by the crystal structure, the site accounting for the atom and the coordinates thereof.

The effect of this embodiment can be exerted within a range in which the basic crystal structure of the green-emitting luminescent material of this embodiment does not change. For example, $Sr_3Al_2Si_{14}ON_{22}$, $Sr_3AlSi_{15}N_{23}$, $Sr_3Al_4Si_{12}O_3N_{20}$, $Sr_3Al_5Si_{11}O_4N_{19}$, and $Sr_3Al_6Si_{10}O_5N_{18}$ are included in the $Sr_3Al_3Si_{13}O_2N_{21}$ group crystal.

It is essential for the green-emitting luminescent material of this embodiment to have such crystal structure. When the length of the chemical bond changes beyond the range, the chemical bond is cleaved to become another crystal. Thus, it becomes impossible to obtain the effect of the present invention.

The green-emitting luminescent material of this embodiment is obtained by using an inorganic compound having a crystal structure substantially the same as that of $Sr_3Al_3Si_{13}O_2N_{21}$ as a base material and substituting a part of the constituent element M with a luminescent center ion Eu. The composition of each element is specified within a predetermined range. In this case, the luminescent material exhibits preferable characteristics such as high luminous efficiency and excellent temperature characteristics.

The luminescent material of this embodiment has the composition represented Formula 1 above. The luminescent material has a peak at a specific diffraction angle (2θ) in X-ray diffraction by the Bragg-Brendano method using Cu-Kα line. That is, it has at least ten peaks at diffraction angles (2θ) of 21.3-21.5°, 21.6-22.0°, 25.0-26.0°, 28.7-29.1°, 29.4-29.8°, 30.1-30.7°, 30.8-31.1°, 31.8-32.1°, 34.0-34.5°, 37.0-37.3°, 37.3-37.6°, 43.5-43.9°, 45.6-46.1°, 48.9-49.4°, 55.7-56.3°, 59.3-59.8°, and 62.8-63.2°.

Particularly, the diffraction peak intensity ($I_{31}$) of the largest peak detected at 2θ=30.1-31.1° is higher than the diffraction peak intensity ($I_{26}$) of the peak detected at 2θ=25.0-26.0°. To achieve a balance between long wavelength emission and good temperature characteristics, the ratio ($I_{31}/I_{26}$) is preferably from 1.1 to 8, more preferably from 3 to 8.

When the luminescent material of this embodiment has the peak intensity in the range, it exerts an effect such that a decrease in luminous intensity is small even if the temperature is increased. Having the peak intensity ratio as mentioned above shows that the orientation based on the crystal shape has a small influence on an X-ray diffraction pattern. In other words, it means that the aspect ratio of the crystal is low and the crystal is isotropic. The isotropically grown crystal is formed to have a three-dimensional hard structure and inhibits the thermal vibration, and the like, of a crystal lattice caused by an increase in temperature. Thus, good temperature characteristics are obtained.

The green-emitting luminescent material according to this embodiment can be produced by mixing raw material powder containing each element and sintering the mixture.

An M raw material can be selected from nitrides and carbides of M. An Al raw material can be selected from nitrides, oxides, and carbides of Al, and an Si raw material can be selected from nitrides, oxides, and carbides of Si. A raw material of the luminescence center element Eu can be selected from oxides, nitrides, and carbonates of Eu.

In this regard, nitrogen can be obtained by the nitride raw material or sintering in an atmosphere containing nitrogen, while oxygen can be obtained from the oxide raw material or the surface-oxidized film of nitride raw materials.

For example, the starting material of $Sr_3N_2$, AlN, $Si_3N_4$, $Al_2O_3$, AlN, and $CeO_2$ is mixed for an intended composition. $Sr_2N$, SrN or mixtures thereof may be used in place of $Sr_3N_2$.

To obtain a luminescent material having a part of the Sr substituted by a predetermined element, for example, a raw material selected from $Ba_3N_2$, $Ca_3N_2$, $CaCl$, $MgCl_2$, and $NaF$ can be used in addition to the above raw materials.

The raw material can be mixed, for example, using a mortar in a glove box. The mixed powder is filled in a crucible and sintered under a predetermined condition to obtain the luminescent material according to this embodiment. The mixed powder is filled in the crucible, for example, by tapping the crucible. The material of the crucible is not particularly limited and the material can be selected from boron nitride, silicon nitride, silicon carbide, carbon, aluminum nitride, sialon, aluminum oxide, molybdenum, tungsten, and the like.

It is desirable that the mixed powder is sintered under pressure more than atmospheric pressure. The sintering under pressure more than atmospheric pressure is advantageous in terms of the fact that silicon nitride is hardly decomposed. In order to suppress the decomposition of silicon nitride at high temperatures, the pressure is preferably 5 atmospheres or more and the sintering temperature is preferably from 1500 to 2000° C. When the sintering is performed under such conditions, a target sintered body is obtained without causing any problem such as sublimation of materials or products. The sintering temperature is preferably from 1800 to 2000° C.

In order to avoid oxidation of AlN, the sintering is desirably performed in a nitrogen atmosphere. The amount of hydrogen in the atmosphere may be up to about 90 atm. %.

It is preferable that the mixed powder is sintered at the above temperature for 0.5 to 4 hours, the sintered material is removed from the crucible, and cracked and sintered under the same conditions again. When a series of steps of removing, cracking, and sintering the powder is repeated about 0 to 10 times, an advantage may be obtained such that luminescent material particles with little fusion between the luminescent material particles and a uniform composition and crystal structure are easily produced.

After sintering, post-treatment such as a cleaning is performed, if necessary, to obtain a luminescent material according to one embodiment. As the cleaning, for example, cleaning with pure water, cleaning with acid or the like can be employed. Usable examples of acid include inorganic acids such as sulfuric acid, nitric acid, hydrochloric acid, and hydrofluoric acid; organic acids such as formic acid, acetic acid, and oxalic acid; and mixed acids thereof.

After the cleaning with acid, post-annealing treatment may be performed, if necessary. The post-annealing treatment can be performed, for example, in a reducing atmosphere containing nitrogen and hydrogen. The crystallinity and the luminous property are improved by performing the post annealing treatment.

The particle diameter of the luminescent material of this embodiment may be 5 µm or more. From the viewpoint of emission characteristics, it is preferably 10 µm or more. It is preferably 61 µm or less, more preferably 50 µm or less, still more preferably 40 µm or less from the viewpoint of improving coating properties.

The luminescent material of this embodiment is a particle which has an aspect ratio of 1 to 7.5, more preferably an aspect ratio of 2 to 7.0, still more preferably an aspect ratio of 2 to 6. When the aspect ratio is within a predetermined range, light extraction efficiency, light distribution properties, coating properties and the like can be improved.

The particle diameter of the luminescent material particle can be determined by observing crystal particles with SEM or by using a particle size distribution meter.

A ratio of the maximum diameter of the luminescent material particle and the minimum diameter in a direction orthogonal to the maximum diameter (maximum diameter/minimum diameter) is defined as the aspect ratio. The aspect ratio can be determined by the following procedure. That is, it is a procedure for measuring the maximum and minimum diameters of the particles from an SEM observation image of each luminescent material particle.

Preferably, the luminescent material of this embodiment is produced without passing through a grinding. The present inventors have found that the luminescent material of this embodiment which is produced without passing through a grinding has excellent emission characteristics as compared with a luminescent material which is formed to have the same diameter by performing the grinding. Specifically, the luminescent material of this embodiment emits light brighter than that of the ground luminescent material when excited under the same conditions. This was confirmed by measuring emission characteristics as to the luminescent material with the same diameter subjected to the grinding and the luminescent material with the same diameter not subjected to the grinding and comparing the results.

A light-emitting device according to one embodiment includes a luminous layer containing the luminescent material and a light-emitting element which excites the luminescent material. FIG. 1 is a schematic view showing the configuration of a light-emitting device according to one embodiment.

In the light-emitting device shown in FIG. 1, leads 101 and 102 and a package cup 103 are arranged on a substrate 100. The substrate 100 and the package cup 103 are formed from resin. The package cup 103 has a recess 105 having an upper portion wider than the bottom thereof. The sidewall of the recess serves as a reflective surface 104.

A light-emitting element 106 is mounted on a central portion of the approximately circular bottom of the recess 105 by an Ag paste. The light-emitting element 106 to be used emits light having an emission peak in a wavelength ranging from 250 to 500 nm. Examples thereof include light emitting diodes and laser diodes. Specifically, a semiconductor light emitting element such as a GaN-based LED is used, however, is not particularly limited thereto.

p- and n-electrodes (not shown) of the light-emitting element 106 are connected, through bonding wires 107 and 108 formed of Au and the like, with the lead 101 and the lead 102, respectively. The arrangement of these leads 101 and 102 may be optionally modified.

As the light-emitting element 106, it is also possible to employ a flip-chip structure in which the n-electrode and the p-electrode are disposed on the same surface thereof. In this case, it is possible to overcome the problems associated with wiring, such as a cut-off or peeling of wire and absorption of light by wire, thereby allowing a semiconductor light-emitting device which is excellent in reliability and luminance to be produced. The following structure can be formed using the light-emitting element having an n-type substrate. An n-electrode is formed on the bottom surface of the n-type substrate of the light-emitting element and a p-electrode is formed on the top surface of a p-type semiconductor layer laminated on the substrate. The n-electrode is mounted on the lead and the p-electrode is connected with the other lead by wire.

A luminous layer 109 containing a luminescent material 110 according to one embodiment is disposed in the recess 105 of the package cup 103. In the luminous layer 109, for example, 5 to 60% by mass of the luminescent material 110 is contained in a resin layer 111 formed of silicone resin, for example. As described above, the luminescent material according to this embodiment contains $Sr_3Al_3Si_{13}O_2N_{21}$ as a host material. Such oxynitrides have high covalent bonding properties. Thus, the luminescent material according to this embodiment is hydrophobic and has good compatibility with resin. Therefore, scattering at an interface between the resin layer and the luminescent material is significantly suppressed and light extraction efficiency is improved.

The luminescent material to according to this embodiment is a green-emitting luminescent material which has a small decrease in the emission intensity even if the temperature is increased. Therefore, the light-emitting device shown in FIG. 1 can emit high intensity green light even if the temperature is increased.

The size and kind of the light-emitting element 106 as well as the size and shape of the recess 105 may be optionally modified.

The light-emitting device according to one embodiment is not limited to the package cup type shown in FIG. 1 and it may be optionally modified. Specifically, in the case of a bullet-shaped LED or a surface-mounted LED, the luminescent material of the embodiment can be used to obtain the same effect.

Figure 2:
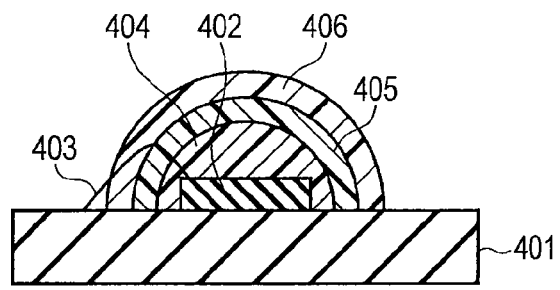
FIG. 2 is a schematic view showing the configuration of a light-emitting device according to another embodiment.

FIG. 2 is a schematic view showing the configuration of a light-emitting device according to another embodiment. In the shown light-emitting device, electrodes (not shown) are formed in a predetermined region of a heat-dissipative insulation substrate 401, and a light-emitting element 402 is arranged thereon. The material of the heat-dissipative insulation substrate may be, for example, AlN.

One of the electrodes in the light-emitting element 402 is formed on the bottom surface and is electrically connected with the electrode of the heat-dissipative insulation substrate 401. The other electrode in the light-emitting element 402 is connected, through a gold wire 403, with the electrode (not shown) on the heat-dissipative insulation substrate 401. As the light-emitting element 402, a light emitting diode which emits light having a wavelength of 250 to 500 nm is used.

A dome-shaped transparent resin layer 404, a first luminous layer 405, and a second luminous layer 406 are sequentially formed on the light-emitting element 402. The transparent resin layer 404 can be formed, for example, using silicone. The first luminous layer 405 may be, for example, a resin layer obtained by dispersing a red-emitting luminescent material. The second luminous layer 406 may be a resin layer obtained by dispersing the green-emitting luminescent material of this embodiment. In the illustrated light-emitting device, the first luminous layer 405 as a red-emitting layer and the second luminous layer 406 as a green-emitting layer are sequentially stacked on the transparent resin layer 404.

In the light-emitting device shown in FIG. 2, the green-emitting luminescent material according to this embodiment is used in combination with a blue-emitting element and the red-emitting luminescent material. That is, the illustrated light-emitting device is a white light-emitting device. As already explained, the green-emitting luminescent material according to this embodiment exhibits a small decrease in emission intensity, even if the temperature is increased. Even if the temperature is increased, a loss of balance between green and red is suppressed. Accordingly, it is possible to obtain a white light-emitting device with few color shifts.

Figure 3:
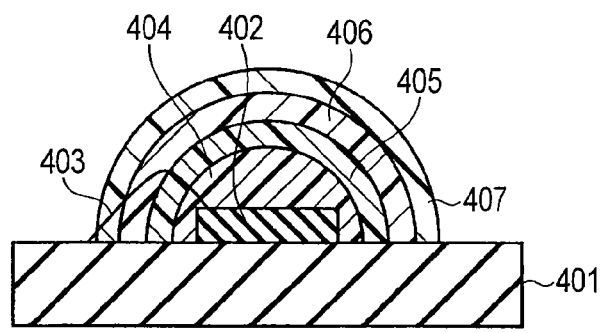
FIG. 3 is a schematic view showing the configuration of a light-emitting device according to another embodiment.

When a light emitting diode which emits light having a wavelength of 250 to 430 nm is used as the light-emitting element 402, the third luminous layer 407 may be formed on the second luminous layer 406 as shown in FIG. 3. The third luminous layer 407 may be, for example, a resin layer obtained by dispersing a blue-emitting luminescent material. In the light-emitting device illustrated, the first luminous layer 405 as a red-emitting layer, the second luminous layer 406 as a green-emitting layer, and the third luminous layer 407 as a blue-emitting layer are sequentially stacked on the transparent resin layer 404.

The light-emitting device shown in FIG. 3 is also a white light-emitting device, similarly to the light-emitting device shown in FIG. 2. The light-emitting device shown in FIG. 3 has the blue-emitting layer thereon, and thus higher color rendering properties are obtained as compared with the light-emitting device shown in FIG. 2.

As described above, the green-emitting luminescent material of this embodiment has a small decrease in emission intensity at high temperatures. Since the luminescent material is used, light having a predetermined color and intensity is emitted from the light-emitting device of this embodiment when driving at high power.

Hereinafter, the specific examples of the luminescent material will be shown.

Example 1

$Sr_3N_2$, EuN, $Si_3N_4$, $Al_2O_3$ and AlN were prepared as an Sr raw material, an Eu raw material, an Si material, and an Al raw material, and each of these materials was weighed out in a vacuum glove box. The blending masses of $Sr_3N_2$, EuN, $Si_3N_4$, $Al_2O_3$, and AlN were 2.830, 0.087, 6.548, 0.340, and 0.547 g, respectively. The weighed raw material powder was dry-blended in an agate mortar.

The obtained mixture was filled in a boron nitride (BN) crucible and sintered at 1850° C. under a nitrogen atmosphere having an atmospheric pressure of 7.5 for 2 hours. When filling the mixture in the crucible, the mixture was densely filled in the crucible by tapping the crucible.

The sintered material was removed from the crucible and cracked in the agate mortar. The cracked and sintered material was again filled in the crucible and sintered at 1850° C. for 2 hours. The series of steps of removing, cracking, and sintering the powder was repeated further twice to obtain the luminescent material of Example 1. The nominal composition of the luminescent material of this example is $(Sr_{0.9825}Eu_{0.0175})_3Si_{14}Al_2ON_{22}$.

Figure 4:
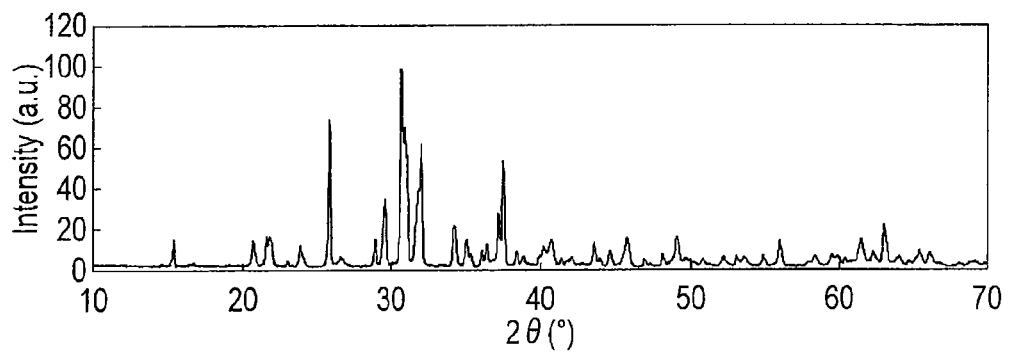
FIG. 4 shows an XRD pattern of the luminescent material of Example.

The XRD pattern of the luminescent material is shown in FIG. 4. The XRD pattern herein was determined based on X-ray diffraction by the Bragg-Brendano method using Cu-Kα line. The diffraction peak intensity ($I_{31}$) of the largest peak detected at 2θ=30.1-31.1° is higher than the diffraction peak intensity ($I_{26}$) of the peak detected at 2θ=25.0-26.0°, which is shown in FIG. 4.

Example 2

A luminescent material of Example 2 was produced in the same manner as Example 1 except that the blending amounts of $Sr_3N_2$ and EuN were changed to 2.837 and 0.075 g, respectively, and the number of times of the sintering including the cracking in the agate mortar was changed to 7. The nominal composition of the luminescent material of this example is $(Sr_{0.985}Eu_{0.015})_3Si_{14}Al_2ON_{22}$.

Figure 5:
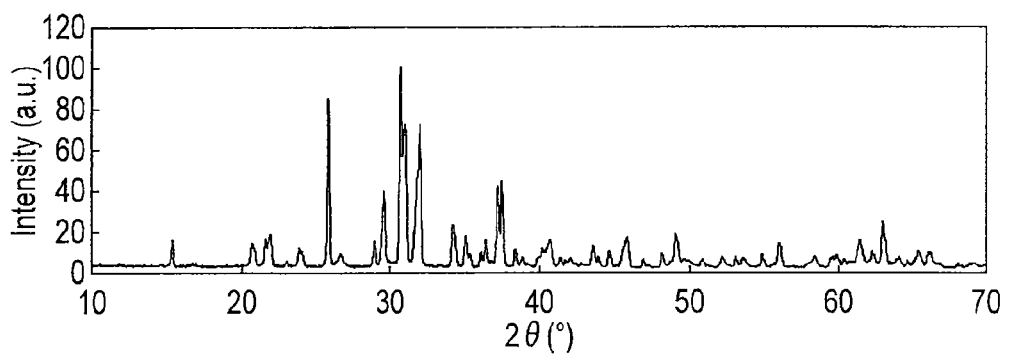
FIG. 5 shows an XRD pattern of the luminescent material of Example.

The XRD pattern of the luminescent material which is determined in the same manner as described above is shown in FIG. 5. The diffraction peak intensity ($I_{31}$) of the largest peak detected at 2θ=30.1-31.1° is higher than the diffraction peak intensity ($I_{26}$) of the peak detected at 2θ=25.0-26.0°, which is shown in FIG. 5.

Example 3

A luminescent material of Example 3 was produced in the same manner as Example 1 except that the blending amounts of $Sr_3N_2$ and EuN were changed to 2.823 and 0.100 g, respectively, and the number of times of the sintering including the cracking in the agate mortar was changed to 3. The nominal composition of the luminescent material of this example is $(Sr_{0.98}Eu_{0.02})_3Si_{14}Al_2ON_{22}$.

Figure 6:
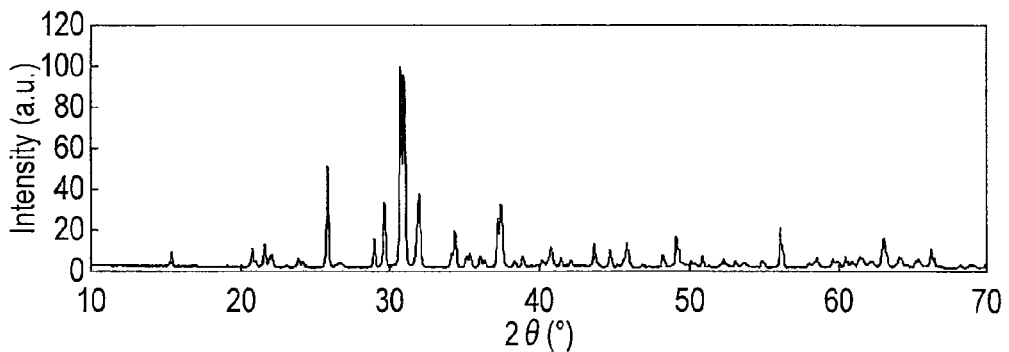
FIG. 6 shows an XRD pattern of the luminescent material of Example.

The XRD pattern of the luminescent material which is determined in the same manner as described above is shown in FIG. 6. The diffraction peak intensity ($I_{31}$) of the largest peak detected at 2θ=30.1-31.1° is higher than the diffraction peak intensity ($I_{26}$) of the peak detected at 2θ=25.0-26.0°, which is shown in FIG. 6.

Example 4

A luminescent material of Example 4 was produced in the same manner as Example 1 except that the blending amounts of $Sr_3N_2$, EuN, $Si_3N_4$, $Al_2O_3$, and AlN were changed to 2.852, 0.050, 6.782, 0.170, and 0.478 g, respectively, and the number of times of the sintering including the cracking in the agate mortar was changed to 3. The nominal composition of the luminescent material of this example is $(Sr_{0.99}Eu_{0.01})_3Si_{14.5}Al_{1.5}O_{0.5}N_{22.5}$.

The XRD pattern of the luminescent material which is determined in the same manner as described above is shown in FIG. 7. The diffraction peak intensity ($I_{31}$) of the largest peak detected at 2θ=30.1-31.1° is higher than the diffraction peak intensity ($I_{26}$) of the peak detected at 2θ=25.0-26.0°, which is shown in FIG. 7.

Example 5

A luminescent material of Example 5 was produced in the same manner as Example 1 except that the blending amounts of $Sr_3N_2$, EuN, $Si_3N_4$, $Al_2O_3$, and AlN were changed to 2.866, 0.025, 7.016, 0.000, and 0.410 g, respectively. The nominal composition of the luminescent material of this example is $(Sr_{0.995}Eu_{0.005})_3Si_{15}AlN_{23}$.

The XRD pattern of the luminescent material which is determined in the same manner as described above is shown in FIG. 8. The diffraction peak intensity ($I_{31}$) of the largest peak detected at 2θ=30.1-31.1° is higher than the diffraction peak intensity ($I_{26}$) of the peak detected at 2θ=25.0-26.0°, which is shown in FIG. 8.

Example 6

A luminescent material of Example 6 was produced in the same manner as Example 5 except that the blending amounts of $Sr_3N_2$ and EuN were changed to 2.878 and 0.005 g, respectively. The nominal composition of the luminescent material of this example is $(Sr_{0.999}Eu_{0.001})_3Si_{15}AlN_{23}$.

The XRD pattern of the luminescent material which is determined in the same manner as described above is shown in FIG. 9. The diffraction peak intensity ($I_{31}$) of the largest peak detected at 2θ=30.1-31.1° is higher than the diffraction peak intensity ($I_{26}$) of the peak detected at 2θ=25.0-26.0°, which is shown in FIG. 9.

Example 7

A luminescent material of Example 7 was produced in the same manner as Example 1 except that the blending amounts of $Si_3N_4$, $Al_2O_3$, and AlN were changed to 6.665, 0.255, and 0.512 g, respectively, and the number of times of the sintering including the cracking in the agate mortar was changed to 6. The nominal composition of the luminescent material of this example is $(Sr_{0.985}Eu_{0.015})_3Si_{14.25}Al_{1.75}O_{0.75}N_{22.25}$.

Figure 10:
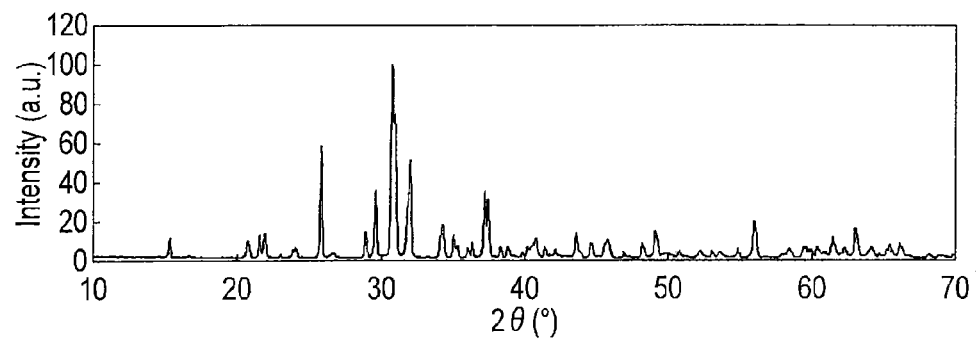
FIG. 10 shows an XRD pattern of the luminescent material of Example.

The XRD pattern of the luminescent material which is determined in the same manner as described above is shown in FIG. 10. The diffraction peak intensity ($I_{31}$) of the largest peak detected at 2θ=30.1-31.1° is higher than the diffraction peak intensity ($I_{26}$) of the peak detected at 2θ=25.0-26.0°, which is shown in FIG. 10.

Example 8

A luminescent material of Example 8 was produced in the same manner as Example 7 except that the blending amounts of $Sr_3N_2$ and EuN were changed to 2.837 and 0.075 g, respectively. The nominal composition of the luminescent material of this example is $(Sr_{0.9825}Eu_{0.0175})_3Si_{14.25}Al_{1.75}O_{0.75}N_{22.25}$.

Figure 11:
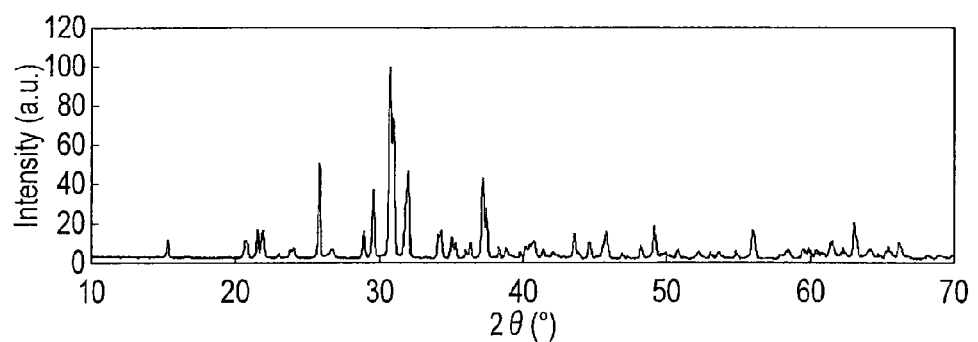
FIG. 11 shows an XRD pattern of the luminescent material of Example.

The XRD pattern of the luminescent material which is determined in the same manner as described above is shown in FIG. 11. The diffraction peak intensity ($I_{31}$) of the largest peak detected at 2θ=30.1-31.1° is higher than the diffraction peak intensity ($I_{26}$) of the peak detected at 2θ=25.0-26.0°, which is shown in FIG. 11.

Example 9

A luminescent material of Example 9 was produced in the same manner as Example 4 except that the blending amounts of $Sr_3N_2$ and EuN were changed to 2.837 and 0.075 g, respectively, and the number of times of the sintering including the cracking in the agate mortar was changed to 7. The nominal composition of the luminescent material of this example is $(Sr_{0.965}Eu_{0.015})_3Si_{14.25}Al_{1.75}O_{0.5}N_{22.5}$.

Figure 12:
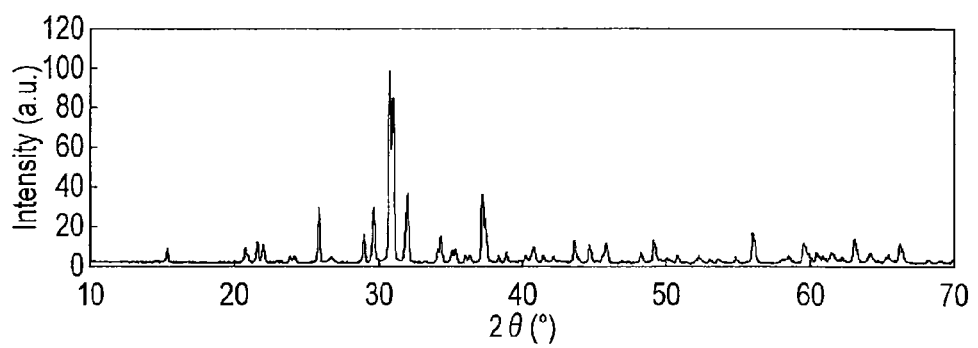
FIG. 12 shows an XRD pattern of the luminescent material of Example.
Figure 20:
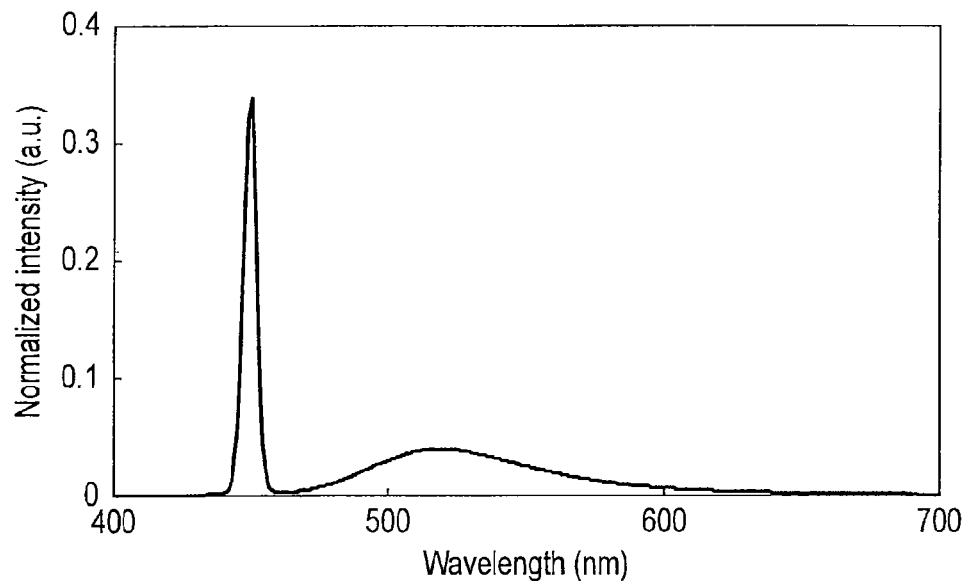
FIG. 20 is a luminescence emission spectrum of a luminescent material of Example.
Figure 21:
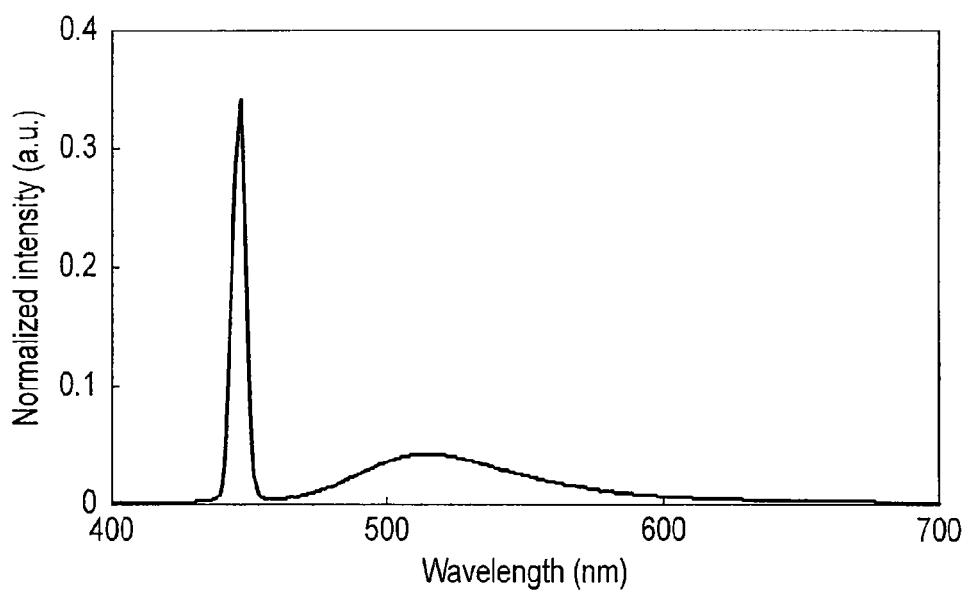
FIG. 21 is a luminescence emission spectrum of a luminescent material of Example.
Figure 28:
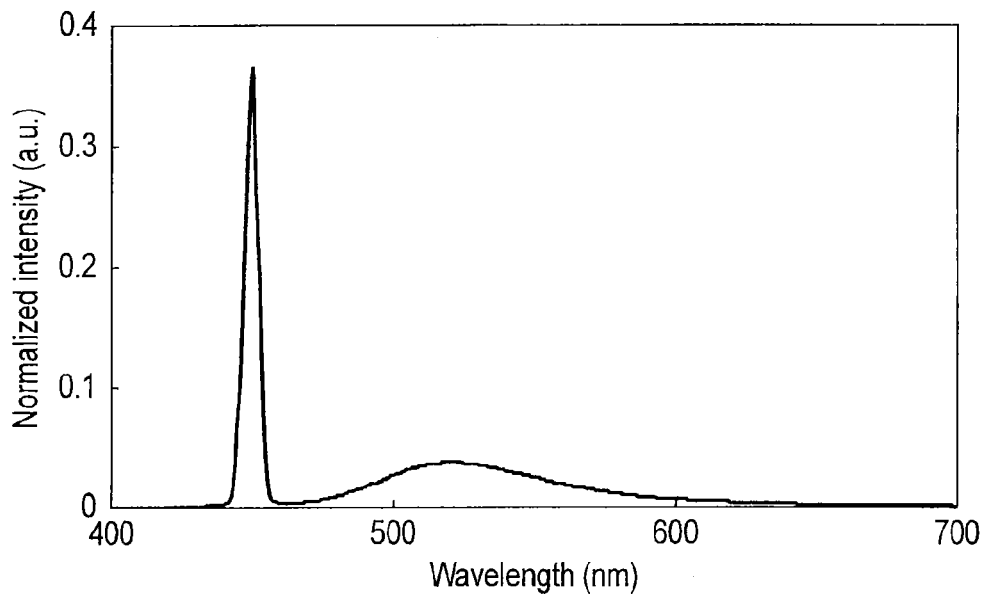
FIG. 28 is a luminescence emission spectrum of a luminescent material of Example.
Figure 29:
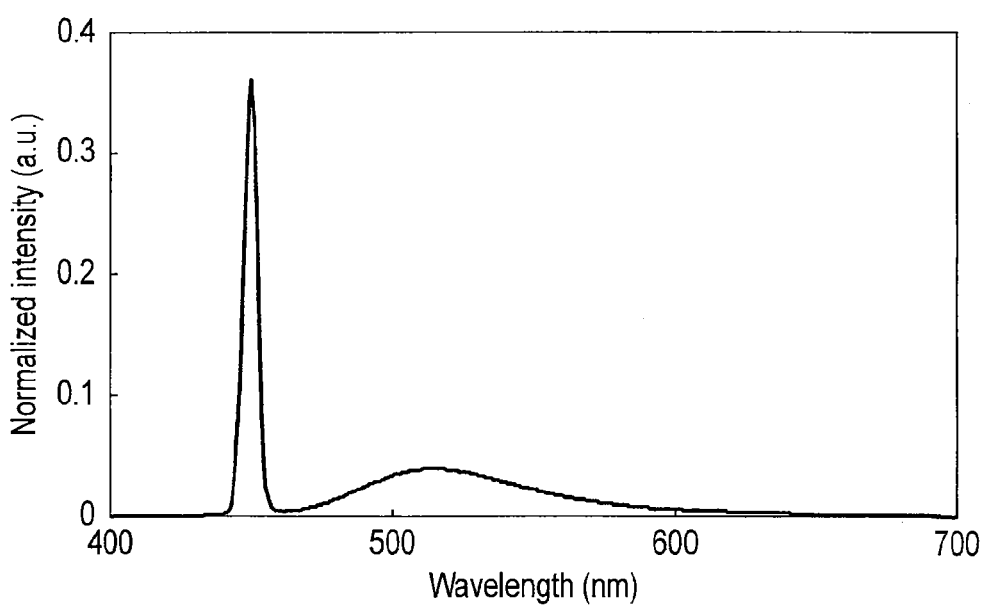
FIG. 29 is a luminescence emission spectrum of a luminescent material of Comparative Example.
Figure 32:
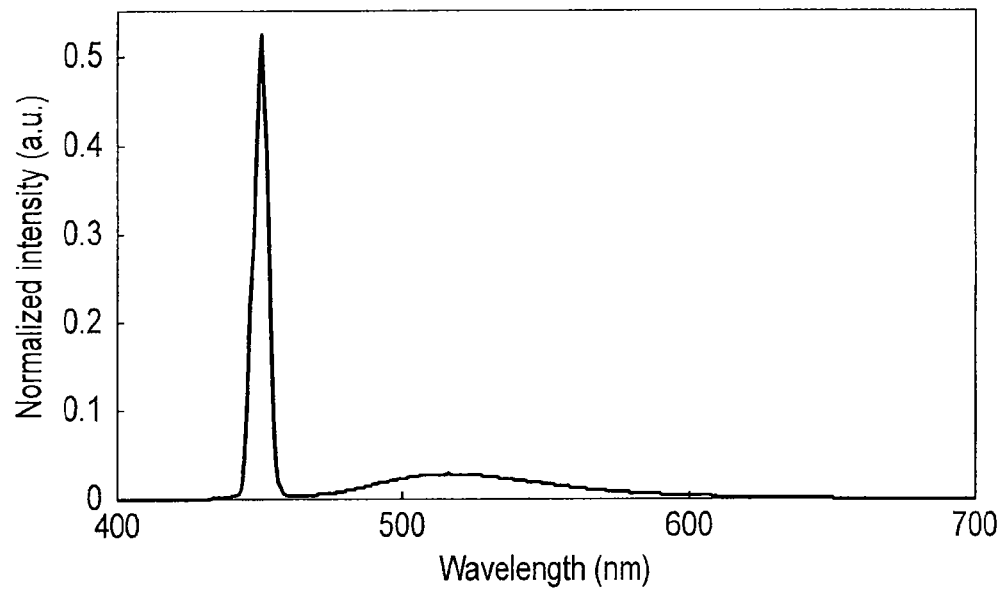
FIG. 32 is a luminescence emission spectrum of a luminescent material of Comparative Example.

The XRD pattern of the luminescent material which is determined in the same manner as described above is shown in FIG. 12. The diffraction peak intensity ($I_{31}$) of the largest peak detected at 2θ=30.1-31.1° is higher than the diffraction peak intensity ($I_{26}$) of the peak detected at 2θ=25.0-26.0°, which is shown in FIG. 12.

The luminescent materials of Examples 1 to 9 were powders with yellow-green body color. When they were excited with black light, yellow light was confirmed. Ten peaks selected from the XRD patterns shown in FIGS. 4 to 12 in descending order of intensity were identified as the strongest peak. The diffraction angles (2θ) were indicated by "◯" in Table 1 below.

TABLE 1

| 2θ(deg) | Example numbers | | | | | | | | |
|---|---|---|---|---|---|---|---|---|---|
| | 1 | 2 | 3 | 4 | 5 | 6 | 7 | 8 | 9 |
| 21.3~21.5 | ◯ | | | | | | | ◯ | |
| 21.6~22.0 | ◯ | ◯ | | | | | | | |
| 25.0~26.0 | ◯ | ◯ | ◯ | ◯ | ◯ | ◯ | ◯ | ◯ | ◯ |
| 28.7~29.1 | | | | | | ◯ | | | ◯ |
| 29.4~29.8 | ◯ | ◯ | ◯ | ◯ | ◯ | ◯ | ◯ | ◯ | ◯ |
| 30.1~30.7 | ◯ | ◯ | | ◯ | ◯ | ◯ | ◯ | ◯ | ◯ |
| 30.8~31.1 | | | ◯ | ◯ | ◯ | ◯ | ◯ | ◯ | ◯ |
| 31.8~32.1 | ◯ | ◯ | ◯ | ◯ | ◯ | ◯ | | | |
| 34.0~34.5 | ◯ | ◯ | ◯ | | ◯ | ◯ | ◯ | | |
| 37.0~37.3 | | ◯ | ◯ | ◯ | ◯ | ◯ | | ◯ | |
| 37.3~37.6 | ◯ | ◯ | ◯ | ◯ | | | ◯ | ◯ | |
| 43.5~43.9 | | | | | ◯ | | | | |
| 45.6~46.1 | ◯ | | | | | ◯ | | | |
| 48.9~49.4 | | ◯ | ◯ | | ◯ | ◯ | | ◯ | |
| 55.7~56.3 | | | ◯ | ◯ | ◯ | ◯ | ◯ | | ◯ |
| 59.3~59.8 | | | | ◯ | | | | | |
| 62.8~63.2 | ◯ | ◯ | | ◯ | | | | ◯ | ◯ |

For each range of 2θ, maximum values of a detected intensity (normalized values) are indicated in Table 2 below. In Table 2, the detected intensities are indicated as relative values, with the maximal value of 2θ in the range of 5 to 70° being set at 100. If a peak top exists in the ranges of 2θ, the values shown in the corresponding columns in Table 2 represent the intensity of the peak top.

TABLE 2

| | Example numbers | | | | | | | | |
|---|---|---|---|---|---|---|---|---|---|
| 2θ(deg) | 1 | 2 | 3 | 4 | 5 | 6 | 7 | 8 | 9 |
| 21.3~21.5 | 17 | 16 | 12 | 10 | 10 | 11 | 13 | 16 | 12 |
| 21.6~22.0 | 17 | 18 | 7 | 5 | 4 | 3 | 14 | 16 | 10 |
| 25.0~26.0 | 74 | 85 | 51 | 31 | 16 | 14 | 58 | 50 | 29 |
| 28.7~29.1 | 15 | 15 | 15 | 13 | 13 | 14 | 15 | 15 | 15 |
| 29.4~29.8 | 33 | 39 | 32 | 28 | 24 | 17 | 36 | 37 | 30 |
| 30.1~30.7 | 100 | 100 | 100 | 72 | 100 | 100 | 100 | 100 | 100 |
| 30.8~31.1 | 71 | 72 | 96 | 100 | 68 | 60 | 75 | 74 | 85 |
| 31.8~32.1 | 62 | 72 | 37 | 26 | 20 | 14 | 51 | 46 | 37 |
| 34.0~34.5 | 21 | 23 | 18 | 14 | 16 | 14 | 17 | 16 | 15 |
| 37.0~37.3 | 28 | 42 | 25 | 21 | 28 | 23 | 35 | 43 | 36 |
| 37.3~37.6 | 54 | 43 | 32 | 20 | 22 | 20 | 31 | 30 | 24 |
| 43.5~43.9 | 14 | 13 | 12 | 10 | 16 | 11 | 14 | 14 | 13 |
| 45.6~46.1 | 17 | 15 | 13 | 10 | 12 | 20 | 11 | 15 | 11 |
| 48.9~49.4 | 17 | 18 | 16 | 11 | 17 | 19 | 15 | 18 | 13 |
| 55.7~56.3 | 15 | 14 | 21 | 20 | 21 | 15 | 20 | 16 | 16 |
| 59.3~59.8 | 7 | 7 | 5 | 14 | 6 | 10 | 7 | 7 | 11 |
| 62.8~63.2 | 22 | 24 | 15 | 16 | 12 | 9 | 16 | 20 | 13 |

Comparative Example 1

A luminescent material of Comparative Example 1 was produced in the same manner as Example 1 except that the blending amounts of $Si_3N_4$, $Al_2O_3$, and AlN were changed to 6.080, 0.680, and 0.683 g, respectively. The nominal composition of the luminescent material of this comparative example is $(Sr_{0.9825}Eu_{0.0175})_3Si_{13}Al_3O_2N_{21}$.

Comparative Example 2

A luminescent material of Comparative Example 2 was produced in the same manner as Comparative Example 1 except that a planetary ball mill was used to mix the raw material powder. The nominal composition of the luminescent material of this comparative example is $(Sr_{0.9825}Eu_{0.0175})_3Si_{13}Al_3O_2N_{21}$.

Comparative Example 3

A luminescent material of Comparative Example 3 was produced in the same manner as Comparative Example 1 except that the blending amounts of $Sr_3N_2$ and EuN were changed to 2.837 and 0.075 g, respectively. The nominal composition of the luminescent material of this comparative example is $(Sr_{0.985}Eu_{0.015})_3Si_{13}Al_3O_2N_{21}$.

Comparative Example 4

A luminescent material of Comparative Example 4 was produced in the same manner as Comparative Example 1 except that the blending amounts of $Sr_3N_2$, EuN, $Si_3N_4$, and AlN were changed to 2.878, 0.005, 6.080, and 0.865 g, respectively, and the number of times of the sintering including the cracking in the agate mortar was changed to 3. The nominal composition of the luminescent material of this comparative example is $(Sr_{0.999}Eu_{0.001})_3Si_{13}Al_3N_{23}$.

The XRD patterns of the luminescent materials of Comparative Examples 1 to 4 were determined in the same manner as described above. The obtained patterns are shown in FIGS. 13 to 16. In each case, it is found that the diffraction peak intensity ($I_{31}$) of the largest peak detected at 2θ=30.1-31.1° is not higher than the diffraction peak intensity ($I_{26}$) of the peak detected at 2θ=25.0-26.0°.

The luminescent materials of Examples 1 to 4 were powders with yellow-green body color. When they were excited with black light, green light was observed. The XRD patterns of the luminescent materials of Comparative Examples 1 to 4 were determined in the same manner as described above. As a result, in the luminescent materials of these comparative examples, ten peaks did not always appear at diffraction angles (2θ) of 21.3-21.5°, 21.6-22.0°, 25.0-26.0°, 28.7-29.1°, 29.4-29.8°, 30.1-30.7°, 30.8-31.1°, 31.8-32.1°, 34.0-34.5°, 37.0-37.3°, 37.3-37.6°, 43.5-43.9°, 45.6-46.1°, 48.9-49.4°, 55.7-56.3°, 59.3-59.8°, and 62.8-63.2°.

The charge composition formula and the charge amount of raw materials of the luminescent materials of Examples 1 to 9 are summarized in Table 3 below. The charge composition formula and the charge amount of raw materials of the luminescent materials of Comparative Examples 1 to 5 are summarized in Table 4 below.

TABLE 3

| | | Charge amount (g) | | | | |
|---|---|---|---|---|---|---|
| Example | Charge composition formula | $Sr_3N_2$ | EuN | $Si_3N_4$ | $Al_2O_3$ | AlN |
| 1 | $(Sr_{0.9825}Eu_{0.0175})_3Si_{14}Al_2ON_{22}$ | 2.830 | 0.087 | 6.548 | 0.340 | 0.547 |
| 2 | $(Sr_{0.985}Eu_{0.015})_3Si_{14}Al_2ON_{22}$ | 2.837 | 0.075 | 6.548 | 0.340 | 0.547 |
| 3 | $(Sr_{0.98}Eu_{0.02})_3Si_{14}Al_2ON_{22}$ | 2.823 | 0.100 | 6.548 | 0.340 | 0.547 |
| 4 | $(Sr_{0.99}Eu_{0.01})_3Si_{14.5}Al_{1.5}O_{0.5}N_{22.5}$ | 2.852 | 0.050 | 6.782 | 0.170 | 0.478 |
| 5 | $(Sr_{0.995}Eu_{0.005})_3Si_{15}AlN_{23}$ | 2.866 | 0.025 | 7.016 | 0.000 | 0.410 |

TABLE 3-continued

| | | Charge amount (g) | | | | |
|---|---|---|---|---|---|---|
| Example | Charge composition formula | $Sr_3N_2$ | EuN | $Si_3N_4$ | $Al_2O_3$ | AlN |
| 6 | $(Sr_{0.999}Eu_{0.001})_3Si_{15}AlN_{23}$ | 2.878 | 0.005 | 7.016 | 0.000 | 0.410 |
| 7 | $(Sr_{0.985}Eu_{0.015})_3Si_{14.25}Al_{1.75}O_{0.75}N_{22.25}$ | 2.837 | 0.075 | 6.665 | 0.255 | 0.512 |
| 8 | $(Sr_{0.9825}Eu_{0.0175})_3Si_{14.25}Al_{1.75}O_{0.75}N_{22.25}$ | 2.830 | 0.087 | 6.665 | 0.255 | 0.512 |
| 9 | $(Sr_{0.985}Eu_{0.015})_3Si_{14.5}Al_{1.5}O_{0.5}N_{22.5}$ | 2.837 | 0.075 | 6.782 | 0.170 | 0.478 |

TABLE 4

| Comparative | | Charge amount (g) | | | | |
|---|---|---|---|---|---|---|
| Example | Charge composition formula | $Sr_3N_2$ | EuN | $Si_3N_4$ | $Al_2O_3$ | AlN |
| 1 | $(Sr_{0.9825}Eu_{0.0175})_3Si_{13}Al_3O_2N_{21}$ | 2.830 | 0.087 | 6.080 | 0.680 | 0.683 |
| 2 | $(Sr_{0.9825}Eu_{0.0175})_3Si_{13}Al_3O_2N_{21}$ | 2.830 | 0.087 | 6.080 | 0.680 | 0.683 |
| 3 | $(Sr_{0.985}Eu_{0.015})_3Si_{13}Al_3O_2N_{21}$ | 2.837 | 0.075 | 6.080 | 0.680 | 0.683 |
| 4 | $(Sr_{0.999}Eu_{0.001})_3Si_{13}Al_3N_{23}$ | 2.878 | 0.005 | 6.080 | 0.000 | 0.865 |

The chemical composition analysis results of the luminescent materials of the examples and comparative examples are shown in Tables 5 and 6 below.

TABLE 5

| Example | Sr | Eu | Si | Al | O | N |
|---|---|---|---|---|---|---|
| 1 | 2.81 | 0.065 | 14.0 | 2.05 | 1.58 | 20 |
| 2 | 2.86 | 0.053 | 14.0 | 2.04 | 1.44 | 21 |
| 3 | 2.67 | 0.063 | 14.5 | 1.48 | 1.07 | 20 |
| 4 | 2.71 | 0.031 | 14.6 | 1.44 | 1.03 | 20 |
| 5 | 2.71 | 0.020 | 15.0 | 0.99 | 0.67 | 20 |
| 6 | 2.70 | 0.0071 | 15.1 | 0.93 | 0.67 | 20 |
| 7 | 2.83 | 0.050 | 14.2 | 1.76 | 1.29 | 21.6 |
| 8 | 2.81 | 0.050 | 14.5 | 1.54 | 1.07 | 21.5 |
| 9 | 2.83 | 0.067 | 14.21 | 1.79 | 1.30 | 21.7 |

TABLE 6

| Comparative Example | Sr | Eu | Si | Al | O | N |
|---|---|---|---|---|---|---|
| 1 | 2.94 | 0.063 | 12.9 | 3.12 | 2.43 | 20 |
| 2 | 2.95 | 0.063 | 12.9 | 3.15 | 2.31 | 21 |
| 3 | 2.91 | 0.058 | 12.8 | 3.18 | 2.15 | 20 |
| 4 | 2.95 | 0.0061 | 13.8 | 2.20 | 0.69 | 21 |

The values of x, y, z, u, and w in Formula 1 below were calculated based on the composition analysis results. The obtained values are summarized in Tables 7 and 8 below along with the value of (u−w).

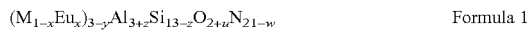

$(M_{1-x}Eu_x)_{3-y}Al_{3+z}Si_{13-z}O_{2+u}N_{21-w}$    Formula 1

TABLE 7

| Example | x | Y | Z | u | w | u − w |
|---|---|---|---|---|---|---|
| 1 | 0.0175 | 0.13 | −0.95 | −0.42 | −1 | −1.42 |
| 2 | 0.015 | 0.09 | −0.96 | −0.56 | 0 | −0.56 |
| 3 | 0.02 | 0.27 | −0.52 | −0.93 | −1 | −1.93 |
| 4 | 0.01 | 0.26 | −1.56 | −0.97 | −1 | −1.97 |
| 5 | 0.005 | 0.27 | −1.01 | −1.33 | −1 | −2.33 |
| 6 | 0.001 | 0.29 | −2.71 | −1.33 | −1 | −2.33 |
| 7 | 0.015 | 0.12 | −1.24 | −0.71 | −0.6 | −0.11 |
| 8 | 0.0175 | 0.14 | −1.46 | −0.93 | −0.5 | −0.43 |
| 9 | 0.015 | 0.10 | −1.21 | −0.7 | −0.7 | 0 |

TABLE 8

| Comparative Example | x | y | z | u | w | u − w |
|---|---|---|---|---|---|---|
| 1 | 0.0175 | 0.00 | 0.12 | 0.43 | −1 | 1.43 |
| 2 | 0.0175 | −0.01 | 0.15 | 0.31 | 0 | 0.31 |
| 3 | 0.015 | 0.03 | 0.18 | 0.15 | −1 | 1.15 |
| 4 | 0.001 | 0.04 | −0.80 | −1.31 | 0 | −1.31 |

As shown in Table 7 above, in the luminescent materials of Examples 1 to 9, the values of x, y, z, u, and u−w in Formula 1 are within a predetermined range such that 0<x≤1, −0.1≤y≤0.3, −3≤z≤−0.52, −1.5≤u≤−0.3, and −3<u−w≤1.

On the other hand, in the luminescent materials of Comparative Examples 1 to 3, the value of z is beyond the range. In the luminescent materials of Comparative Examples 1 and 3, the value of (u−w) is also beyond the range.

The particle diameters and aspect ratios of the luminescent materials of the examples and the comparative examples were measured by the following procedures.

Particle diameter: It was calculated by measuring the maximum diameter of particles from an SEM observation image of each luminescent material particle.

Aspect ratio: It was calculated by measuring the maximum diameter of particles and the minimum diameter in a direction perpendicular to the maximum diameter from the SEM observation image of each luminescent material particle and dividing the maximum diameter by the minimum diameter.

The obtained results are summarized in Tables 9 and 10 below with the Si/Al ratio, the O/N ratio, and the peak intensity ratio ($I_{31}/I_{26}$).

TABLE 9

| Example | Si/Al | O/N | $I_{31}/I_{26}$ | Particle diameter (μm) | Aspect ratio |
|---|---|---|---|---|---|
| 1 | 6.83 | 0.079 | 1.33 | 44 | 6.7 |
| 2 | 6.86 | 0.069 | 1.18 | 51 | 7.4 |
| 3 | 9.78 | 0.054 | 1.98 | 36 | 7.2 |
| 4 | 10.1 | 0.052 | 3.13 | 34 | 5.1 |
| 5 | 15.15 | 0.034 | 6.40 | 39 | 3.6 |
| 6 | 16.24 | 0.034 | 7.27 | 61 | 2.8 |
| 7 | 8.07 | 0.060 | 1.72 | 22 | 6.0 |
| 8 | 9.42 | 0.050 | 1.98 | 28 | 6.1 |
| 9 | 7.94 | 0.060 | 3.45 | 28 | 3.8 |

TABLE 10

| Comparative Example | Si/Al | O/N | $I_{31}/I_{26}$ | Particle diameter (μm) | Aspect ratio |
|---|---|---|---|---|---|
| 1 | 4.13 | 0.12 | 0.45 | 34 | 10.6 |
| 2 | 4.10 | 0.11 | 0.51 | 50 | 10.2 |
| 3 | 4.03 | 0.11 | 0.46 | 28 | 9.8 |
| 4 | 6.27 | 0.033 | 0.5 | 48 | 7.8 |

From the results of the tables, it is found that the luminescent materials of the examples show a high Si/Al ratio and a low O/N ratio as compared with the luminescent materials of the comparative examples. The luminescent materials of the examples show a low aspect ratio as compared with those of the comparative examples.

FIG. 17 shows a relationship between the Si/Al ratio and the peak intensity ratio ($I_{31}/I_{26}$). FIG. 18 shows a relationship between the O/N ratio of the luminescent material and the peak intensity ratio ($I_{31}/I_{26}$). The peak intensity ratio ($I_{31}/I_{26}$) also increased with an increase in the Si/Al ratio. When the Si/Al ratio became higher than 5, a peak intensity ratio ($I_{31}/I_{26}$) exceeding 1 was obtained. On the other hand, when the O/N ratio increased, the peak intensity ratio ($I_{31}/I_{26}$) decreased. If the O/N ratio is less than 0.07, a peak intensity ratio ($I_{31}/I_{26}$) exceeding 1 is obtained.

FIG. 19 shows a relationship between the value of y in Formula 1 and the peak intensity ratio ($I_{31}/I_{26}$). The peak intensity ratio ($I_{31}/I_{26}$) tends to become higher as the value of y increases.

Emission characteristics of the luminescent materials of the examples and the comparative examples were examined. Specifically, synthetic quartz plates were filled with respective luminescent materials. These plates were placed in an integrating sphere. The luminescent materials were excited with light having a peak wavelength of 450 nm dispersed from an xenon lamp. At that time, the absorption coefficient, quantum efficiency, and luminous efficiency were measured. The obtained results are summarized in Tables 11 and 12 below.

TABLE 11

| Example | Absorption coefficient | Quantum efficiency | Luminous efficiency |
|---|---|---|---|
| 1 | 0.66 | 0.89 | 0.59 |
| 2 | 0.66 | 0.91 | 0.60 |
| 3 | 0.69 | 0.86 | 0.60 |
| 4 | 0.62 | 0.80 | 0.49 |
| 5 | 0.60 | 0.80 | 0.48 |
| 6 | 0.49 | 0.71 | 0.34 |
| 7 | 0.65 | 0.90 | 0.59 |
| 8 | 0.68 | 0.91 | 0.62 |
| 9 | 0.64 | 0.88 | 0.56 |

TABLE 12

| Comparative Example | Absorption coefficient | Quantum efficiency | Luminous efficiency |
|---|---|---|---|
| 1 | 0.64 | 0.91 | 0.58 |
| 2 | 0.67 | 0.89 | 0.59 |
| 3 | 0.64 | 0.93 | 0.60 |
| 4 | 0.48 | 0.87 | 0.41 |

Numerical Values of emission intensities of the luminescent materials of Examples 1 to 9 are indicated in Tables 13 to 27.

Luminescence emission spectra of the luminescent materials of Examples 1 to 9 and Comparative Examples 1 to 4 are shown in FIGS. 20 to 32. In the drawings, an emission with a narrow half width near 450 nm is reflection of excitation light and is not emission of the luminescent material. All of the luminescent materials have a peak in a wavelength ranging from 490 to 580 nm.

TABLE 13

| Wavelength (nm) | Example numbers | | | | | | | | |
|---|---|---|---|---|---|---|---|---|---|
| | 1 | 2 | 3 | 4 | 5 | 6 | 7 | 8 | 9 |
| 400.53 | 0.0001 | 0.0001 | 0.0001 | 0.0001 | 0.0001 | 0.0002 | 0.0001 | 0.0001 | 0.0001 |
| 401.28 | 0.0001 | 0.0001 | 0.0000 | 0.0001 | 0.0001 | 0.0002 | 0.0001 | 0.0001 | 0.0001 |
| 402.04 | 0.0001 | 0.0001 | 0.0002 | 0.0001 | 0.0002 | 0.0002 | 0.0001 | 0.0001 | 0.0001 |
| 402.79 | 0.0001 | 0.0001 | 0.0001 | 0.0001 | 0.0001 | 0.0002 | 0.0001 | 0.0001 | 0.0001 |
| 403.54 | 0.0001 | 0.0001 | 0.0001 | 0.0001 | 0.0001 | 0.0002 | 0.0001 | 0.0001 | 0.0001 |
| 404.30 | 0.0001 | 0.0001 | 0.0001 | 0.0001 | 0.0001 | 0.0002 | 0.0001 | 0.0002 | 0.0001 |
| 405.05 | 0.0001 | 0.0001 | 0.0001 | 0.0001 | 0.0001 | 0.0002 | 0.0001 | 0.0001 | 0.0001 |
| 405.81 | 0.0002 | 0.0001 | 0.0001 | 0.0001 | 0.0002 | 0.0002 | 0.0001 | 0.0001 | 0.0001 |
| 406.56 | 0.0002 | 0.0002 | 0.0001 | 0.0001 | 0.0002 | 0.0002 | 0.0002 | 0.0002 | 0.0001 |
| 407.32 | 0.0001 | 0.0001 | 0.0001 | 0.0001 | 0.0001 | 0.0002 | 0.0002 | 0.0002 | 0.0001 |
| 408.07 | 0.0001 | 0.0002 | 0.0001 | 0.0002 | 0.0001 | 0.0002 | 0.0001 | 0.0001 | 0.0001 |
| 408.82 | 0.0001 | 0.0002 | 0.0002 | 0.0002 | 0.0002 | 0.0002 | 0.0001 | 0.0001 | 0.0001 |
| 409.58 | 0.0002 | 0.0002 | 0.0001 | 0.0001 | 0.0001 | 0.0002 | 0.0001 | 0.0002 | 0.0001 |
| 410.33 | 0.0001 | 0.0002 | 0.0002 | 0.0001 | 0.0001 | 0.0002 | 0.0001 | 0.0002 | 0.0001 |
| 411.09 | 0.0001 | 0.0002 | 0.0001 | 0.0002 | 0.0002 | 0.0002 | 0.0002 | 0.0001 | 0.0001 |
| 411.84 | 0.0002 | 0.0002 | 0.0001 | 0.0002 | 0.0001 | 0.0003 | 0.0002 | 0.0002 | 0.0002 |
| 412.60 | 0.0002 | 0.0002 | 0.0001 | 0.0002 | 0.0002 | 0.0002 | 0.0002 | 0.0002 | 0.0002 |
| 413.35 | 0.0002 | 0.0002 | 0.0002 | 0.0002 | 0.0002 | 0.0003 | 0.0002 | 0.0002 | 0.0002 |
| 414.10 | 0.0002 | 0.0003 | 0.0002 | 0.0002 | 0.0002 | 0.0003 | 0.0002 | 0.0002 | 0.0002 |
| 414.86 | 0.0002 | 0.0004 | 0.0002 | 0.0002 | 0.0002 | 0.0003 | 0.0002 | 0.0002 | 0.0002 |

TABLE 14

| Wavelength (nm) | Example numbers | | | | | | | | |
|---|---|---|---|---|---|---|---|---|---|
| | 1 | 2 | 3 | 4 | 5 | 6 | 7 | 8 | 9 |
| 415.61 | 0.0002 | 0.0003 | 0.0002 | 0.0003 | 0.0002 | 0.0004 | 0.0002 | 0.0002 | 0.0002 |
| 416.37 | 0.0002 | 0.0003 | 0.0002 | 0.0002 | 0.0003 | 0.0004 | 0.0002 | 0.0003 | 0.0003 |
| 417.12 | 0.0002 | 0.0003 | 0.0002 | 0.0002 | 0.0002 | 0.0004 | 0.0003 | 0.0002 | 0.0003 |
| 417.87 | 0.0003 | 0.0003 | 0.0002 | 0.0003 | 0.0003 | 0.0004 | 0.0002 | 0.0003 | 0.0002 |
| 418.63 | 0.0002 | 0.0004 | 0.0003 | 0.0003 | 0.0003 | 0.0004 | 0.0003 | 0.0003 | 0.0003 |
| 419.38 | 0.0003 | 0.0003 | 0.0002 | 0.0004 | 0.0003 | 0.0004 | 0.0003 | 0.0003 | 0.0003 |
| 420.14 | 0.0003 | 0.0004 | 0.0003 | 0.0004 | 0.0003 | 0.0005 | 0.0003 | 0.0003 | 0.0003 |
| 420.89 | 0.0003 | 0.0004 | 0.0003 | 0.0003 | 0.0004 | 0.0005 | 0.0003 | 0.0003 | 0.0003 |
| 421.64 | 0.0003 | 0.0004 | 0.0003 | 0.0004 | 0.0004 | 0.0005 | 0.0003 | 0.0003 | 0.0003 |
| 422.40 | 0.0004 | 0.0004 | 0.0003 | 0.0004 | 0.0004 | 0.0005 | 0.0003 | 0.0003 | 0.0003 |
| 423.15 | 0.0003 | 0.0005 | 0.0003 | 0.0004 | 0.0004 | 0.0006 | 0.0004 | 0.0003 | 0.0004 |
| 423.90 | 0.0004 | 0.0005 | 0.0003 | 0.0004 | 0.0004 | 0.0006 | 0.0003 | 0.0003 | 0.0004 |
| 424.66 | 0.0004 | 0.0004 | 0.0003 | 0.0005 | 0.0004 | 0.0006 | 0.0004 | 0.0003 | 0.0004 |
| 425.41 | 0.0004 | 0.0005 | 0.0004 | 0.0005 | 0.0005 | 0.0006 | 0.0004 | 0.0004 | 0.0004 |
| 426.16 | 0.0005 | 0.0005 | 0.0004 | 0.0005 | 0.0005 | 0.0007 | 0.0004 | 0.0004 | 0.0004 |
| 426.92 | 0.0005 | 0.0006 | 0.0004 | 0.0005 | 0.0005 | 0.0007 | 0.0004 | 0.0004 | 0.0005 |
| 427.67 | 0.0004 | 0.0006 | 0.0004 | 0.0005 | 0.0006 | 0.0008 | 0.0005 | 0.0004 | 0.0005 |
| 428.42 | 0.0004 | 0.0007 | 0.0004 | 0.0006 | 0.0006 | 0.0008 | 0.0005 | 0.0005 | 0.0005 |
| 429.18 | 0.0005 | 0.0007 | 0.0005 | 0.0006 | 0.0006 | 0.0008 | 0.0005 | 0.0005 | 0.0005 |
| 429.93 | 0.0006 | 0.0008 | 0.0005 | 0.0007 | 0.0006 | 0.0009 | 0.0005 | 0.0005 | 0.0006 |

TABLE 15

| Wavelength (nm) | Example numbers | | | | | | | | |
|---|---|---|---|---|---|---|---|---|---|
| | 1 | 2 | 3 | 4 | 5 | 6 | 7 | 8 | 9 |
| 430.69 | 0.0006 | 0.0009 | 0.0006 | 0.0006 | 0.0007 | 0.0010 | 0.0006 | 0.0005 | 0.0006 |
| 431.44 | 0.0006 | 0.0010 | 0.0005 | 0.0007 | 0.0007 | 0.0010 | 0.0006 | 0.0006 | 0.0006 |
| 432.19 | 0.0007 | 0.0011 | 0.0006 | 0.0008 | 0.0008 | 0.0011 | 0.0006 | 0.0006 | 0.0007 |
| 432.94 | 0.0007 | 0.0013 | 0.0007 | 0.0009 | 0.0009 | 0.0012 | 0.0008 | 0.0006 | 0.0008 |
| 433.70 | 0.0009 | 0.0015 | 0.0007 | 0.0009 | 0.0010 | 0.0013 | 0.0008 | 0.0007 | 0.0008 |
| 434.45 | 0.0009 | 0.0018 | 0.0008 | 0.0011 | 0.0011 | 0.0015 | 0.0009 | 0.0008 | 0.0009 |
| 435.20 | 0.0010 | 0.0020 | 0.0009 | 0.0012 | 0.0013 | 0.0017 | 0.0010 | 0.0009 | 0.0011 |
| 435.96 | 0.0012 | 0.0022 | 0.0011 | 0.0014 | 0.0014 | 0.0019 | 0.0012 | 0.0010 | 0.0012 |
| 436.71 | 0.0014 | 0.0025 | 0.0012 | 0.0016 | 0.0016 | 0.0022 | 0.0013 | 0.0012 | 0.0014 |
| 437.46 | 0.0016 | 0.0031 | 0.0013 | 0.0019 | 0.0018 | 0.0025 | 0.0015 | 0.0014 | 0.0016 |
| 438.22 | 0.0018 | 0.0042 | 0.0016 | 0.0021 | 0.0022 | 0.0028 | 0.0018 | 0.0016 | 0.0019 |
| 438.97 | 0.0021 | 0.0072 | 0.0018 | 0.0024 | 0.0024 | 0.0032 | 0.0020 | 0.0019 | 0.0021 |
| 439.72 | 0.0023 | 0.0147 | 0.0020 | 0.0027 | 0.0027 | 0.0036 | 0.0022 | 0.0021 | 0.0024 |
| 440.48 | 0.0027 | 0.0307 | 0.0023 | 0.0032 | 0.0030 | 0.0041 | 0.0026 | 0.0024 | 0.0027 |
| 441.23 | 0.0032 | 0.0584 | 0.0027 | 0.0039 | 0.0036 | 0.0049 | 0.0031 | 0.0029 | 0.0033 |
| 441.98 | 0.0044 | 0.0972 | 0.0037 | 0.0056 | 0.0048 | 0.0067 | 0.0043 | 0.0039 | 0.0046 |
| 442.73 | 0.0076 | 0.1427 | 0.0061 | 0.0105 | 0.0078 | 0.0116 | 0.0075 | 0.0068 | 0.0080 |
| 443.49 | 0.0155 | 0.1904 | 0.0124 | 0.0222 | 0.0156 | 0.0236 | 0.0151 | 0.0140 | 0.0164 |
| 444.24 | 0.0323 | 0.2377 | 0.0260 | 0.0460 | 0.0330 | 0.0500 | 0.0315 | 0.0290 | 0.0341 |
| 444.99 | 0.0617 | 0.2825 | 0.0502 | 0.0839 | 0.0642 | 0.0956 | 0.0602 | 0.0551 | 0.0647 |

TABLE 16

| Wavelength (nm) | Example numbers | | | | | | | | |
|---|---|---|---|---|---|---|---|---|---|
| | 1 | 2 | 3 | 4 | 5 | 6 | 7 | 8 | 9 |
| 445.74 | 0.1028 | 0.3238 | 0.0846 | 0.1328 | 0.1091 | 0.1581 | 0.1003 | 0.0919 | 0.1074 |
| 446.50 | 0.1506 | 0.3413 | 0.1244 | 0.1863 | 0.1620 | 0.2294 | 0.1472 | 0.1350 | 0.1574 |
| 447.25 | 0.2009 | 0.3039 | 0.1659 | 0.2403 | 0.2173 | 0.3021 | 0.1968 | 0.1804 | 0.2096 |
| 448.00 | 0.2505 | 0.2461 | 0.2068 | 0.2922 | 0.2718 | 0.3727 | 0.2458 | 0.2251 | 0.2610 |
| 448.75 | 0.2971 | 0.1894 | 0.2471 | 0.3420 | 0.3240 | 0.4413 | 0.2913 | 0.2668 | 0.3080 |
| 449.51 | 0.3408 | 0.1293 | 0.2867 | 0.3868 | 0.3751 | 0.5092 | 0.3328 | 0.3055 | 0.3499 |
| 450.26 | 0.3601 | 0.0783 | 0.3110 | 0.3865 | 0.4060 | 0.5437 | 0.3509 | 0.3217 | 0.3661 |
| 451.01 | 0.3204 | 0.0433 | 0.2847 | 0.3302 | 0.3719 | 0.4897 | 0.3121 | 0.2863 | 0.3228 |
| 451.76 | 0.2596 | 0.0224 | 0.2360 | 0.2659 | 0.3081 | 0.4045 | 0.2517 | 0.2310 | 0.2586 |
| 452.52 | 0.2001 | 0.0117 | 0.1877 | 0.1999 | 0.2440 | 0.3196 | 0.1931 | 0.1770 | 0.1966 |
| 453.27 | 0.1367 | 0.0069 | 0.1331 | 0.1309 | 0.1730 | 0.2230 | 0.1313 | 0.1203 | 0.1327 |
| 454.02 | 0.0831 | 0.0049 | 0.0833 | 0.0773 | 0.1082 | 0.1378 | 0.0791 | 0.0727 | 0.0795 |
| 454.77 | 0.0460 | 0.0041 | 0.0471 | 0.0417 | 0.0616 | 0.0775 | 0.0436 | 0.0398 | 0.0436 |
| 455.53 | 0.0241 | 0.0038 | 0.0249 | 0.0213 | 0.0323 | 0.0400 | 0.0225 | 0.0208 | 0.0225 |
| 456.28 | 0.0126 | 0.0035 | 0.0126 | 0.0110 | 0.0163 | 0.0201 | 0.0117 | 0.0108 | 0.0117 |
| 457.03 | 0.0075 | 0.0034 | 0.0070 | 0.0066 | 0.0089 | 0.0109 | 0.0070 | 0.0063 | 0.0069 |
| 457.78 | 0.0055 | 0.0032 | 0.0047 | 0.0049 | 0.0059 | 0.0071 | 0.0050 | 0.0044 | 0.0050 |

TABLE 16-continued

| Wavelength | Example numbers | | | | | | | | |
|---|---|---|---|---|---|---|---|---|---|
| (nm) | 1 | 2 | 3 | 4 | 5 | 6 | 7 | 8 | 9 |
| 458.53 | 0.0047 | 0.0032 | 0.0038 | 0.0042 | 0.0046 | 0.0056 | 0.0042 | 0.0038 | 0.0042 |
| 459.29 | 0.0043 | 0.0033 | 0.0035 | 0.0037 | 0.0040 | 0.0048 | 0.0038 | 0.0034 | 0.0037 |
| 460.04 | 0.0040 | 0.0033 | 0.0032 | 0.0035 | 0.0036 | 0.0043 | 0.0035 | 0.0031 | 0.0035 |

TABLE 17

| Wavelength | Example numbers | | | | | | | | |
|---|---|---|---|---|---|---|---|---|---|
| (nm) | 1 | 2 | 3 | 4 | 5 | 6 | 7 | 8 | 9 |
| 460.79 | 0.0039 | 0.0034 | 0.0031 | 0.0032 | 0.0033 | 0.0039 | 0.0034 | 0.0030 | 0.0032 |
| 461.54 | 0.0039 | 0.0036 | 0.0030 | 0.0030 | 0.0031 | 0.0036 | 0.0033 | 0.0029 | 0.0031 |
| 462.29 | 0.0039 | 0.0038 | 0.0029 | 0.0030 | 0.0029 | 0.0034 | 0.0032 | 0.0028 | 0.0030 |
| 463.05 | 0.0040 | 0.0040 | 0.0029 | 0.0030 | 0.0029 | 0.0032 | 0.0032 | 0.0028 | 0.0030 |
| 463.80 | 0.0041 | 0.0043 | 0.0029 | 0.0029 | 0.0029 | 0.0031 | 0.0033 | 0.0028 | 0.0030 |
| 464.55 | 0.0043 | 0.0045 | 0.0030 | 0.0029 | 0.0029 | 0.0031 | 0.0034 | 0.0029 | 0.0031 |
| 465.30 | 0.0046 | 0.0048 | 0.0032 | 0.0030 | 0.0028 | 0.0031 | 0.0036 | 0.0030 | 0.0032 |
| 466.05 | 0.0047 | 0.0050 | 0.0033 | 0.0031 | 0.0030 | 0.0031 | 0.0037 | 0.0032 | 0.0034 |
| 466.80 | 0.0051 | 0.0054 | 0.0036 | 0.0033 | 0.0031 | 0.0032 | 0.0040 | 0.0033 | 0.0035 |
| 467.56 | 0.0054 | 0.0057 | 0.0037 | 0.0034 | 0.0032 | 0.0033 | 0.0042 | 0.0036 | 0.0037 |
| 468.31 | 0.0057 | 0.0060 | 0.0040 | 0.0036 | 0.0033 | 0.0034 | 0.0044 | 0.0038 | 0.0039 |
| 469.06 | 0.0061 | 0.0064 | 0.0042 | 0.0038 | 0.0035 | 0.0035 | 0.0047 | 0.0040 | 0.0041 |
| 469.81 | 0.0065 | 0.0068 | 0.0045 | 0.0039 | 0.0036 | 0.0036 | 0.0049 | 0.0042 | 0.0043 |
| 470.56 | 0.0069 | 0.0073 | 0.0048 | 0.0041 | 0.0037 | 0.0037 | 0.0052 | 0.0044 | 0.0045 |
| 471.31 | 0.0072 | 0.0076 | 0.0051 | 0.0044 | 0.0039 | 0.0037 | 0.0055 | 0.0047 | 0.0047 |
| 472.06 | 0.0077 | 0.0081 | 0.0054 | 0.0045 | 0.0041 | 0.0039 | 0.0058 | 0.0050 | 0.0050 |
| 472.82 | 0.0082 | 0.0085 | 0.0058 | 0.0048 | 0.0043 | 0.0041 | 0.0062 | 0.0053 | 0.0053 |
| 473.57 | 0.0087 | 0.0091 | 0.0061 | 0.0051 | 0.0045 | 0.0042 | 0.0065 | 0.0056 | 0.0056 |
| 474.32 | 0.0092 | 0.0095 | 0.0064 | 0.0053 | 0.0047 | 0.0044 | 0.0069 | 0.0059 | 0.0059 |
| 475.07 | 0.0097 | 0.0101 | 0.0068 | 0.0056 | 0.0049 | 0.0045 | 0.0073 | 0.0063 | 0.0062 |

TABLE 18

| Wavelength | Example numbers | | | | | | | | |
|---|---|---|---|---|---|---|---|---|---|
| (nm) | 1 | 2 | 3 | 4 | 5 | 6 | 7 | 8 | 9 |
| 475.82 | 0.0103 | 0.0106 | 0.0072 | 0.0059 | 0.0051 | 0.0047 | 0.0077 | 0.0067 | 0.0066 |
| 476.57 | 0.0108 | 0.0112 | 0.0078 | 0.0062 | 0.0054 | 0.0049 | 0.0082 | 0.0071 | 0.0069 |
| 477.32 | 0.0114 | 0.0118 | 0.0082 | 0.0066 | 0.0057 | 0.0051 | 0.0086 | 0.0075 | 0.0073 |
| 478.07 | 0.0120 | 0.0125 | 0.0087 | 0.0070 | 0.0060 | 0.0053 | 0.0092 | 0.0080 | 0.0077 |
| 478.82 | 0.0126 | 0.0131 | 0.0093 | 0.0073 | 0.0062 | 0.0055 | 0.0096 | 0.0084 | 0.0081 |
| 479.58 | 0.0133 | 0.0138 | 0.0098 | 0.0077 | 0.0066 | 0.0057 | 0.0101 | 0.0089 | 0.0086 |
| 480.33 | 0.0139 | 0.0145 | 0.0103 | 0.0081 | 0.0069 | 0.0060 | 0.0107 | 0.0094 | 0.0090 |
| 481.08 | 0.0147 | 0.0152 | 0.0108 | 0.0086 | 0.0072 | 0.0062 | 0.0113 | 0.0099 | 0.0095 |
| 481.83 | 0.0155 | 0.0159 | 0.0115 | 0.0091 | 0.0076 | 0.0065 | 0.0118 | 0.0105 | 0.0100 |
| 482.58 | 0.0160 | 0.0166 | 0.0121 | 0.0096 | 0.0080 | 0.0067 | 0.0125 | 0.0109 | 0.0105 |
| 483.33 | 0.0167 | 0.0174 | 0.0127 | 0.0100 | 0.0083 | 0.0069 | 0.0130 | 0.0116 | 0.0111 |
| 484.08 | 0.0175 | 0.0182 | 0.0135 | 0.0105 | 0.0088 | 0.0073 | 0.0136 | 0.0122 | 0.0116 |
| 484.83 | 0.0182 | 0.0189 | 0.0142 | 0.0111 | 0.0092 | 0.0075 | 0.0144 | 0.0128 | 0.0123 |
| 485.58 | 0.0191 | 0.0198 | 0.0148 | 0.0117 | 0.0096 | 0.0079 | 0.0149 | 0.0136 | 0.0128 |
| 486.33 | 0.0198 | 0.0206 | 0.0155 | 0.0121 | 0.0100 | 0.0081 | 0.0157 | 0.0142 | 0.0135 |
| 487.08 | 0.0206 | 0.0213 | 0.0162 | 0.0128 | 0.0106 | 0.0084 | 0.0163 | 0.0148 | 0.0141 |
| 487.83 | 0.0213 | 0.0222 | 0.0170 | 0.0134 | 0.0110 | 0.0087 | 0.0170 | 0.0155 | 0.0148 |
| 488.59 | 0.0221 | 0.0231 | 0.0177 | 0.0140 | 0.0115 | 0.0091 | 0.0178 | 0.0162 | 0.0154 |
| 489.34 | 0.0229 | 0.0239 | 0.0186 | 0.0146 | 0.0119 | 0.0094 | 0.0185 | 0.0171 | 0.0161 |
| 490.09 | 0.0238 | 0.0247 | 0.0193 | 0.0152 | 0.0125 | 0.0097 | 0.0194 | 0.0177 | 0.0168 |

TABLE 19

| Wavelength | Example numbers | | | | | | | | |
|---|---|---|---|---|---|---|---|---|---|
| (nm) | 1 | 2 | 3 | 4 | 5 | 6 | 7 | 8 | 9 |
| 490.84 | 0.0245 | 0.0255 | 0.0201 | 0.0159 | 0.0129 | 0.0100 | 0.0201 | 0.0186 | 0.0175 |
| 491.59 | 0.0253 | 0.0263 | 0.0209 | 0.0165 | 0.0135 | 0.0104 | 0.0208 | 0.0192 | 0.0182 |
| 492.34 | 0.0261 | 0.0270 | 0.0215 | 0.0174 | 0.0140 | 0.0107 | 0.0215 | 0.0201 | 0.0189 |
| 493.09 | 0.0268 | 0.0279 | 0.0225 | 0.0179 | 0.0145 | 0.0111 | 0.0224 | 0.0209 | 0.0197 |
| 493.84 | 0.0275 | 0.0288 | 0.0232 | 0.0185 | 0.0150 | 0.0114 | 0.0232 | 0.0216 | 0.0204 |

TABLE 19-continued

| Wavelength (nm) | Example numbers | | | | | | | | |
|---|---|---|---|---|---|---|---|---|---|
| | 1 | 2 | 3 | 4 | 5 | 6 | 7 | 8 | 9 |
| 494.59 | 0.0283 | 0.0295 | 0.0239 | 0.0192 | 0.0155 | 0.0117 | 0.0239 | 0.0224 | 0.0211 |
| 495.34 | 0.0289 | 0.0304 | 0.0247 | 0.0199 | 0.0160 | 0.0120 | 0.0247 | 0.0232 | 0.0218 |
| 496.09 | 0.0297 | 0.0311 | 0.0254 | 0.0206 | 0.0167 | 0.0122 | 0.0255 | 0.0240 | 0.0226 |
| 496.84 | 0.0303 | 0.0320 | 0.0263 | 0.0212 | 0.0171 | 0.0125 | 0.0262 | 0.0248 | 0.0234 |
| 497.59 | 0.0310 | 0.0326 | 0.0270 | 0.0220 | 0.0176 | 0.0128 | 0.0270 | 0.0256 | 0.0241 |
| 498.34 | 0.0317 | 0.0333 | 0.0278 | 0.0226 | 0.0182 | 0.0132 | 0.0277 | 0.0265 | 0.0248 |
| 499.09 | 0.0324 | 0.0341 | 0.0285 | 0.0232 | 0.0186 | 0.0135 | 0.0286 | 0.0273 | 0.0256 |
| 499.84 | 0.0330 | 0.0347 | 0.0292 | 0.0238 | 0.0192 | 0.0138 | 0.0293 | 0.0281 | 0.0263 |
| 500.59 | 0.0336 | 0.0354 | 0.0298 | 0.0245 | 0.0197 | 0.0141 | 0.0300 | 0.0289 | 0.0270 |
| 501.34 | 0.0340 | 0.0360 | 0.0305 | 0.0253 | 0.0201 | 0.0143 | 0.0306 | 0.0296 | 0.0277 |
| 502.09 | 0.0346 | 0.0366 | 0.0311 | 0.0256 | 0.0206 | 0.0145 | 0.0314 | 0.0303 | 0.0284 |
| 502.84 | 0.0351 | 0.0372 | 0.0317 | 0.0263 | 0.0211 | 0.0148 | 0.0321 | 0.0311 | 0.0290 |
| 503.59 | 0.0355 | 0.0377 | 0.0324 | 0.0269 | 0.0216 | 0.0150 | 0.0327 | 0.0318 | 0.0297 |
| 504.34 | 0.0360 | 0.0382 | 0.0329 | 0.0273 | 0.0219 | 0.0153 | 0.0333 | 0.0324 | 0.0303 |
| 505.09 | 0.0365 | 0.0387 | 0.0335 | 0.0279 | 0.0224 | 0.0155 | 0.0340 | 0.0332 | 0.0309 |

TABLE 20

| Wavelength (nm) | Example numbers | | | | | | | | |
|---|---|---|---|---|---|---|---|---|---|
| | 1 | 2 | 3 | 4 | 5 | 6 | 7 | 8 | 9 |
| 505.84 | 0.0369 | 0.0391 | 0.0341 | 0.0285 | 0.0228 | 0.0157 | 0.0345 | 0.0338 | 0.0315 |
| 506.59 | 0.0372 | 0.0395 | 0.0344 | 0.0289 | 0.0231 | 0.0158 | 0.0351 | 0.0345 | 0.0321 |
| 507.34 | 0.0376 | 0.0397 | 0.0349 | 0.0293 | 0.0235 | 0.0161 | 0.0356 | 0.0351 | 0.0326 |
| 508.09 | 0.0378 | 0.0402 | 0.0353 | 0.0297 | 0.0238 | 0.0162 | 0.0362 | 0.0356 | 0.0331 |
| 508.84 | 0.0381 | 0.0404 | 0.0355 | 0.0302 | 0.0242 | 0.0163 | 0.0366 | 0.0364 | 0.0336 |
| 509.59 | 0.0383 | 0.0407 | 0.0359 | 0.0306 | 0.0245 | 0.0165 | 0.0370 | 0.0368 | 0.0340 |
| 510.33 | 0.0385 | 0.0410 | 0.0362 | 0.0309 | 0.0248 | 0.0166 | 0.0374 | 0.0373 | 0.0344 |
| 511.08 | 0.0385 | 0.0411 | 0.0365 | 0.0313 | 0.0250 | 0.0168 | 0.0377 | 0.0377 | 0.0348 |
| 511.83 | 0.0388 | 0.0412 | 0.0367 | 0.0315 | 0.0253 | 0.0169 | 0.0379 | 0.0382 | 0.0352 |
| 512.58 | 0.0388 | 0.0413 | 0.0370 | 0.0318 | 0.0256 | 0.0169 | 0.0382 | 0.0386 | 0.0355 |
| 513.33 | 0.0389 | 0.0414 | 0.0372 | 0.0320 | 0.0257 | 0.0170 | 0.0386 | 0.0390 | 0.0359 |
| 514.08 | 0.0388 | 0.0413 | 0.0373 | 0.0322 | 0.0260 | 0.0172 | 0.0388 | 0.0392 | 0.0362 |
| 514.83 | 0.0388 | 0.0413 | 0.0375 | 0.0325 | 0.0262 | 0.0172 | 0.0388 | 0.0396 | 0.0364 |
| 515.58 | 0.0388 | 0.0413 | 0.0374 | 0.0327 | 0.0263 | 0.0172 | 0.0391 | 0.0397 | 0.0366 |
| 516.33 | 0.0387 | 0.0413 | 0.0375 | 0.0328 | 0.0264 | 0.0173 | 0.0392 | 0.0401 | 0.0367 |
| 517.08 | 0.0386 | 0.0412 | 0.0376 | 0.0329 | 0.0265 | 0.0173 | 0.0394 | 0.0402 | 0.0369 |
| 517.83 | 0.0386 | 0.0410 | 0.0376 | 0.0330 | 0.0266 | 0.0173 | 0.0395 | 0.0404 | 0.0370 |
| 518.58 | 0.0384 | 0.0408 | 0.0375 | 0.0332 | 0.0268 | 0.0174 | 0.0395 | 0.0405 | 0.0371 |
| 519.32 | 0.0381 | 0.0407 | 0.0374 | 0.0333 | 0.0268 | 0.0174 | 0.0394 | 0.0406 | 0.0371 |
| 520.07 | 0.0380 | 0.0404 | 0.0373 | 0.0332 | 0..0269 | 0.0172 | 0.0395 | 0.0407 | 0.0371 |

TABLE 21

| Wavelength (nm) | Example numbers | | | | | | | | |
|---|---|---|---|---|---|---|---|---|---|
| | 1 | 2 | 3 | 4 | 5 | 6 | 7 | 8 | 9 |
| 520.82 | 0.0378 | 0.0403 | 0.0372 | 0.0331 | 0.0269 | 0.0172 | 0.0393 | 0.0406 | 0.0371 |
| 521.57 | 0.0376 | 0.0399 | 0.0370 | 0.0333 | 0.0269 | 0.0172 | 0.0392 | 0.0405 | 0.0370 |
| 522.32 | 0.0373 | 0.0396 | 0.0369 | 0.0330 | 0.0270 | 0.0172 | 0.0391 | 0.0404 | 0.0370 |
| 523.07 | 0.0369 | 0.0393 | 0.0367 | 0.0330 | 0.0269 | 0.0171 | 0.0388 | 0.0405 | 0.0369 |
| 523.82 | 0.0367 | 0.0391 | 0.0364 | 0.0331 | 0.0268 | 0.0170 | 0.0386 | 0.0403 | 0.0368 |
| 524.57 | 0.0363 | 0.0387 | 0.0363 | 0.0329 | 0.0268 | 0.0171 | 0.0385 | 0.0401 | 0.0366 |
| 525.32 | 0.0360 | 0.0382 | 0.0360 | 0.0326 | 0.0268 | 0.0168 | 0.0382 | 0.0399 | 0.0365 |
| 526.06 | 0.0357 | 0.0379 | 0.0357 | 0.0326 | 0.0266 | 0.0168 | 0.0379 | 0.0398 | 0.0362 |
| 526.81 | 0.0353 | 0.0375 | 0.0354 | 0.0323 | 0.0265 | 0.0167 | 0.0378 | 0.0395 | 0.0360 |
| 527.56 | 0.0348 | 0.0370 | 0.0352 | 0.0322 | 0.0264 | 0.0166 | 0.0373 | 0.0395 | 0.0358 |
| 528.31 | 0.0345 | 0.0366 | 0.0347 | 0.0320 | 0.0263 | 0.0166 | 0.0372 | 0.0390 | 0.0355 |
| 529.06 | 0.0341 | 0.0362 | 0.0345 | 0.0319 | 0.0262 | 0.0163 | 0.0366 | 0.0387 | 0.0352 |
| 529.81 | 0.0337 | 0.0358 | 0.0340 | 0.0317 | 0.0260 | 0.0163 | 0.0363 | 0.0383 | 0.0349 |
| 530.55 | 0.0333 | 0.0353 | 0.0337 | 0.0315 | 0.0258 | 0.0161 | 0.0359 | 0.0382 | 0.0346 |
| 531.30 | 0.0329 | 0.0348 | 0.0333 | 0.0312 | 0.0255 | 0.0160 | 0.0356 | 0.0378 | 0.0343 |
| 532.05 | 0.0325 | 0.0344 | 0.0329 | 0.0311 | 0.0253 | 0.0158 | 0.0351 | 0.0373 | 0.0339 |
| 532.80 | 0.0320 | 0.0339 | 0.0326 | 0.0308 | 0.0252 | 0.0156 | 0.0348 | 0.0369 | 0.0336 |
| 533.55 | 0.0316 | 0.0334 | 0.0322 | 0.0303 | 0.0249 | 0.0156 | 0.0343 | 0.0365 | 0.0332 |
| 534.30 | 0.0309 | 0.0330 | 0.0317 | 0.0300 | 0.0247 | 0.0154 | 0.0337 | 0.0361 | 0.0329 |
| 535.04 | 0.0305 | 0.0326 | 0.0313 | 0.0299 | 0.0245 | 0.0153 | 0.0334 | 0.0359 | 0.0325 |

TABLE 22

| Wavelength (nm) | Example numbers | | | | | | | | |
|---|---|---|---|---|---|---|---|---|---|
| | 1 | 2 | 3 | 4 | 5 | 6 | 7 | 8 | 9 |
| 535.79 | 0.0300 | 0.0321 | 0.0310 | 0.0295 | 0.0244 | 0.0151 | 0.0331 | 0.0353 | 0.0321 |
| 536.54 | 0.0296 | 0.0316 | 0.0306 | 0.0292 | 0.0241 | 0.0149 | 0.0327 | 0.0350 | 0.0318 |
| 537.29 | 0.0293 | 0.0311 | 0.0301 | 0.0289 | 0.0238 | 0.0148 | 0.0321 | 0.0346 | 0.0314 |
| 538.04 | 0.0287 | 0.0305 | 0.0298 | 0.0286 | 0.0236 | 0.0146 | 0.0317 | 0.0341 | 0.0309 |
| 538.78 | 0.0282 | 0.0300 | 0.0293 | 0.0283 | 0.0233 | 0.0144 | 0.0314 | 0.0336 | 0.0306 |
| 539.53 | 0.0278 | 0.0295 | 0.0288 | 0.0279 | 0.0231 | 0.0143 | 0.0309 | 0.0331 | 0.0302 |
| 540.28 | 0.0275 | 0.0290 | 0.0285 | 0.0276 | 0.0229 | 0.0140 | 0.0304 | 0.0328 | 0.0298 |
| 541.03 | 0.0269 | 0.0285 | 0.0280 | 0.0272 | 0.0225 | 0.0139 | 0.0299 | 0.0322 | 0.0293 |
| 541.77 | 0.0264 | 0.0281 | 0.0275 | 0.0267 | 0.0222 | 0.0137 | 0.0295 | 0.0317 | 0.0288 |
| 542.52 | 0.0259 | 0.0275 | 0.0271 | 0.0263 | 0.0219 | 0.0135 | 0.0288 | 0.0312 | 0.0284 |
| 543.27 | 0.0254 | 0.0270 | 0.0268 | 0.0261 | 0.0217 | 0.0133 | 0.0286 | 0.0308 | 0.0280 |
| 544.02 | 0.0250 | 0.0265 | 0.0262 | 0.0257 | 0.0213 | 0.0131 | 0.0279 | 0.0303 | 0.0276 |
| 544.77 | 0.0245 | 0.0261 | 0.0258 | 0.0253 | 0.0211 | 0.0128 | 0.0276 | 0.0297 | 0.0271 |
| 545.51 | 0.0242 | 0.0257 | 0.0254 | 0.0248 | 0.0208 | 0.0127 | 0.0271 | 0.0294 | 0.0267 |
| 546.26 | 0.0237 | 0.0251 | 0.0250 | 0.0245 | 0.0205 | 0.0125 | 0.0267 | 0.0288 | 0.0263 |
| 547.01 | 0.0233 | 0.0247 | 0.0245 | 0.0242 | 0.0201 | 0.0124 | 0.0261 | 0.0284 | 0.0258 |
| 547.76 | 0.0228 | 0.0241 | 0.0241 | 0.0237 | 0.0199 | 0.0121 | 0.0257 | 0.0279 | 0.0254 |
| 548.50 | 0.0224 | 0.0237 | 0.0237 | 0.0234 | 0.0196 | 0.0119 | 0.0251 | 0.0275 | 0.0249 |
| 549.25 | 0.0219 | 0.0233 | 0.0233 | 0.0228 | 0.0193 | 0.0117 | 0.0247 | 0.0271 | 0.0245 |
| 550.00 | 0.0215 | 0.0229 | 0.0229 | 0.0227 | 0.0191 | 0.0115 | 0.0243 | 0.0265 | 0.0241 |

TABLE 23

| Wavelength (nm) | Example numbers | | | | | | | | |
|---|---|---|---|---|---|---|---|---|---|
| | 1 | 2 | 3 | 4 | 5 | 6 | 7 | 8 | 9 |
| 550.74 | 0.0212 | 0.0223 | 0.0224 | 0.0222 | 0.0187 | 0.0113 | 0.0238 | 0.0259 | 0.0237 |
| 551.49 | 0.0208 | 0.0219 | 0.0220 | 0.0219 | 0.0184 | 0.0112 | 0.0233 | 0.0255 | 0.0232 |
| 552.24 | 0.0203 | 0.0215 | 0.0216 | 0.0216 | 0.0181 | 0.0109 | 0.0229 | 0.0250 | 0.0228 |
| 552.99 | 0.0199 | 0.0210 | 0.0212 | 0.0211 | 0.0178 | 0.0108 | 0.0225 | 0.0246 | 0.0223 |
| 553.73 | 0.0195 | 0.0206 | 0.0207 | 0.0208 | 0.0175 | 0.0106 | 0.0219 | 0.0241 | 0.0219 |
| 554.48 | 0.0191 | 0.0202 | 0.0204 | 0.0203 | 0.0172 | 0.0104 | 0.0216 | 0.0236 | 0.0215 |
| 555.23 | 0.0187 | 0.0198 | 0.0200 | 0.0199 | 0.0169 | 0.0102 | 0.0211 | 0.0232 | 0.0211 |
| 555.97 | 0.0183 | 0.0193 | 0.0197 | 0.0195 | 0.0166 | 0.0101 | 0.0207 | 0.0228 | 0.0207 |
| 556.72 | 0.0180 | 0.0189 | 0.0193 | 0.0192 | 0.0163 | 0.0098 | 0.0203 | 0.0223 | 0.0203 |
| 557.47 | 0.0176 | 0.0186 | 0.0188 | 0.0188 | 0.0160 | 0.0098 | 0.0199 | 0.0220 | 0.0199 |
| 558.21 | 0.0173 | 0.0184 | 0.0184 | 0.0185 | 0.0158 | 0.0095 | 0.0195 | 0.0215 | 0.0196 |
| 558.96 | 0.0170 | 0.0180 | 0.0181 | 0.0181 | 0.0156 | 0.0094 | 0.0191 | 0.0211 | 0.0192 |
| 559.71 | 0.0166 | 0.0176 | 0.0178 | 0.0177 | 0.0152 | 0.0092 | 0.0187 | 0.0206 | 0.0188 |
| 560.46 | 0.0162 | 0.0172 | 0.0173 | 0.0173 | 0.0149 | 0.0089 | 0.0183 | 0.0201 | 0.0183 |
| 561.20 | 0.0159 | 0.0168 | 0.0171 | 0.0169 | 0.0146 | 0.0088 | 0.0179 | 0.0198 | 0.0180 |
| 561.95 | 0.0158 | 0.0165 | 0.0168 | 0.0168 | 0.0145 | 0.0087 | 0.0178 | 0.0196 | 0.0179 |
| 562.69 | 0.0154 | 0.0161 | 0.0166 | 0.0164 | 0.0142 | 0.0086 | 0.0174 | 0.0193 | 0.0175 |
| 563.44 | 0.0150 | 0.0157 | 0.0162 | 0.0161 | 0.0140 | 0.0083 | 0.0170 | 0.0188 | 0.0171 |
| 564.19 | 0.0147 | 0.0155 | 0.0159 | 0.0156 | 0.0136 | 0.0082 | 0.0166 | 0.0183 | 0.0168 |
| 564.93 | 0.0145 | 0.0151 | 0.0155 | 0.0153 | 0.0134 | 0.0080 | 0.0162 | 0.0181 | 0.0164 |

TABLE 24

| Wavelength (nm) | Example numbers | | | | | | | | |
|---|---|---|---|---|---|---|---|---|---|
| | 1 | 2 | 3 | 4 | 5 | 6 | 7 | 8 | 9 |
| 565.68 | 0.0141 | 0.0148 | 0.0151 | 0.0150 | 0.0131 | 0.0079 | 0.0159 | 0.0176 | 0.0161 |
| 566.43 | 0.0139 | 0.0145 | 0.0149 | 0.0146 | 0.0129 | 0.0077 | 0.0156 | 0.0173 | 0.0158 |
| 567.17 | 0.0136 | 0.0142 | 0.0146 | 0.0143 | 0.0127 | 0.0076 | 0.0153 | 0.0170 | 0.0155 |
| 567.92 | 0.0134 | 0.0139 | 0.0143 | 0.0140 | 0.0125 | 0.0074 | 0.0150 | 0.0167 | 0.0152 |
| 568.67 | 0.0131 | 0.0136 | 0.0140 | 0.0138 | 0.0123 | 0.0073 | 0.0147 | 0.0163 | 0.0149 |
| 569.41 | 0.0128 | 0.0133 | 0.0138 | 0.0135 | 0.0120 | 0.0072 | 0.0144 | 0.0160 | 0.0146 |
| 570.16 | 0.0126 | 0.0129 | 0.0134 | 0.0131 | 0.0118 | 0.0070 | 0.0141 | 0.0157 | 0.0143 |
| 570.90 | 0.0123 | 0.0127 | 0.0131 | 0.0128 | 0.0115 | 0.0069 | 0.0138 | 0.0153 | 0.0140 |
| 571.65 | 0.0120 | 0.0124 | 0.0129 | 0.0126 | 0.0114 | 0.0068 | 0.0135 | 0.0150 | 0.0137 |
| 572.40 | 0.0118 | 0.0121 | 0.0126 | 0.0124 | 0.0111 | 0.0067 | 0.0131 | 0.0146 | 0.0134 |
| 573.14 | 0.0115 | 0.0118 | 0.0124 | 0.0120 | 0.0110 | 0.0065 | 0.0128 | 0.0144 | 0.0131 |
| 573.89 | 0.0113 | 0.0115 | 0.0121 | 0.0119 | 0.0108 | 0.0064 | 0.0126 | 0.0140 | 0.0128 |
| 574.63 | 0.0110 | 0.0113 | 0.0118 | 0.0115 | 0.0107 | 0.0062 | 0.0123 | 0.0137 | 0.0126 |
| 575.38 | 0.0107 | 0.0110 | 0.0116 | 0.0113 | 0.0104 | 0.0061 | 0.0120 | 0.0134 | 0.0123 |
| 576.13 | 0.0106 | 0.0108 | 0.0114 | 0.0111 | 0.0102 | 0.0059 | 0.0117 | 0.0131 | 0.0120 |
| 576.87 | 0.0104 | 0.0105 | 0.0111 | 0.0108 | 0.0100 | 0.0059 | 0.0115 | 0.0128 | 0.0117 |
| 577.62 | 0.0102 | 0.0103 | 0.0108 | 0.0106 | 0.0099 | 0.0057 | 0.0112 | 0.0126 | 0.0115 |

TABLE 24-continued

| Wavelength | Example numbers | | | | | | | | |
|---|---|---|---|---|---|---|---|---|---|
| (nm) | 1 | 2 | 3 | 4 | 5 | 6 | 7 | 8 | 9 |
| 578.36 | 0.0099 | 0.0101 | 0.0106 | 0.0105 | 0.0097 | 0.0056 | 0.0110 | 0.0122 | 0.0112 |
| 579.11 | 0.0097 | 0.0098 | 0.0103 | 0.0102 | 0.0096 | 0.0056 | 0.0106 | 0.0121 | 0.0110 |
| 579.85 | 0.0096 | 0.0095 | 0.0101 | 0.0100 | 0.0094 | 0.0055 | 0.0106 | 0.0116 | 0.0108 |

TABLE 25

| Wavelength | Example numbers | | | | | | | | |
|---|---|---|---|---|---|---|---|---|---|
| (nm) | 1 | 2 | 3 | 4 | 5 | 6 | 7 | 8 | 9 |
| 580.60 | 0.0093 | 0.0093 | 0.0100 | 0.0099 | 0.0092 | 0.0053 | 0.0102 | 0.0114 | 0.0105 |
| 581.35 | 0.0092 | 0.0091 | 0.0098 | 0.0096 | 0.0091 | 0.0054 | 0.0099 | 0.0112 | 0.0103 |
| 582.09 | 0.0089 | 0.0089 | 0.0095 | 0.0094 | 0.0089 | 0.0052 | 0.0097 | 0.0110 | 0.0100 |
| 582.84 | 0.0088 | 0.0088 | 0.0093 | 0.0093 | 0.0088 | 0.0051 | 0.0095 | 0.0107 | 0.0098 |
| 583.58 | 0.0086 | 0.0085 | 0.0090 | 0.0091 | 0.0087 | 0.0050 | 0.0092 | 0.0104 | 0.0096 |
| 584.33 | 0.0084 | 0.0083 | 0.0089 | 0.0088 | 0.0085 | 0.0049 | 0.0091 | 0.0102 | 0.0094 |
| 585.07 | 0.0083 | 0.0081 | 0.0087 | 0.0087 | 0.0084 | 0.0048 | 0.0088 | 0.0100 | 0.0092 |
| 585.82 | 0.0081 | 0.0079 | 0.0086 | 0.0085 | 0.0083 | 0.0047 | 0.0087 | 0.0097 | 0.0090 |
| 586.56 | 0.0079 | 0.0078 | 0.0084 | 0.0083 | 0.0081 | 0.0047 | 0.0085 | 0.0096 | 0.0088 |
| 587.31 | 0.0077 | 0.0076 | 0.0082 | 0.0082 | 0.0080 | 0.0046 | 0.0083 | 0.0094 | 0.0086 |
| 588.05 | 0.0076 | 0.0075 | 0.0080 | 0.0080 | 0.0079 | 0.0045 | 0.0080 | 0.0091 | 0.0084 |
| 588.80 | 0.0074 | 0.0073 | 0.0079 | 0.0078 | 0.0078 | 0.0044 | 0.0078 | 0.0089 | 0.0082 |
| 589.54 | 0.0074 | 0.0072 | 0.0077 | 0.0077 | 0.0076 | 0.0043 | 0.0077 | 0.0088 | 0.0081 |
| 590.29 | 0.0072 | 0.0070 | 0.0076 | 0.0075 | 0.0076 | 0.0043 | 0.0076 | 0.0085 | 0.0079 |
| 591.03 | 0.0070 | 0.0069 | 0.0074 | 0.0073 | 0.0075 | 0.0043 | 0.0074 | 0.0084 | 0.0077 |
| 591.78 | 0.0070 | 0.0067 | 0.0073 | 0.0073 | 0.0074 | 0.0042 | 0.0072 | 0.0082 | 0.0076 |
| 592.52 | 0.0068 | 0.0066 | 0.0072 | 0.0071 | 0.0072 | 0.0041 | 0.0071 | 0.0080 | 0.0075 |
| 593.27 | 0.0067 | 0.0064 | 0.0071 | 0.0069 | 0.0071 | 0.0041 | 0.0069 | 0.0080 | 0.0073 |
| 594.01 | 0.0066 | 0.0063 | 0.0069 | 0.0068 | 0.0071 | 0.0040 | 0.0068 | 0.0077 | 0.0072 |
| 594.76 | 0.0065 | 0.0062 | 0.0068 | 0.0066 | 0.0071 | 0.0040 | 0.0067 | 0.0076 | 0.0071 |

TABLE 26

| Wavelength | Example numbers | | | | | | | | |
|---|---|---|---|---|---|---|---|---|---|
| (nm) | 1 | 2 | 3 | 4 | 5 | 6 | 7 | 8 | 9 |
| 595.50 | 0.0063 | 0.0061 | 0.0067 | 0.0066 | 0.0070 | 0.0039 | 0.0066 | 0.0074 | 0.0069 |
| 596.25 | 0.0063 | 0.0059 | 0.0065 | 0.0064 | 0.0069 | 0.0038 | 0.0063 | 0.0072 | 0.0068 |
| 596.99 | 0.0061 | 0.0058 | 0.0064 | 0.0062 | 0.0069 | 0.0037 | 0.0063 | 0.0072 | 0.0067 |
| 597.73 | 0.0061 | 0.0057 | 0.0063 | 0.0061 | 0.0068 | 0.0037 | 0.0062 | 0.0070 | 0.0066 |
| 598.48 | 0.0059 | 0.0056 | 0.0062 | 0.0060 | 0.0066 | 0.0037 | 0.0061 | 0.0069 | 0.0064 |
| 599.22 | 0.0059 | 0.0054 | 0.0060 | 0.0058 | 0.0066 | 0.0037 | 0.0059 | 0.0067 | 0.0063 |
| 599.97 | 0.0058 | 0.0053 | 0.0060 | 0.0058 | 0.0065 | 0.0036 | 0.0058 | 0.0066 | 0.0062 |
| 600.71 | 0.0056 | 0.0052 | 0.0059 | 0.0056 | 0.0065 | 0.0035 | 0.0057 | 0.0065 | 0.0061 |
| 601.46 | 0.0055 | 0.0052 | 0.0058 | 0.0055 | 0.0064 | 0.0035 | 0.0056 | 0.0064 | 0.0060 |
| 602.20 | 0.0055 | 0.0050 | 0.0057 | 0.0054 | 0.0063 | 0.0034 | 0.0054 | 0.0063 | 0.0059 |
| 602.95 | 0.0054 | 0.0050 | 0.0056 | 0.0053 | 0.0063 | 0.0034 | 0.0053 | 0.0061 | 0.0058 |
| 603.69 | 0.0053 | 0.0048 | 0.0055 | 0.0052 | 0.0062 | 0.0033 | 0.0053 | 0.0061 | 0.0057 |
| 604.43 | 0.0052 | 0.0048 | 0.0054 | 0.0051 | 0.0061 | 0.0034 | 0.0051 | 0.0059 | 0.0056 |
| 605.18 | 0.0052 | 0.0047 | 0.0053 | 0.0050 | 0.0061 | 0.0033 | 0.0051 | 0.0058 | 0.0055 |
| 605.92 | 0.0050 | 0.0045 | 0.0051 | 0.0049 | 0.0060 | 0.0033 | 0.0049 | 0.0057 | 0.0054 |
| 606.67 | 0.0050 | 0.0045 | 0.0051 | 0.0048 | 0.0059 | 0.0032 | 0.0048 | 0.0056 | 0.0053 |
| 607.41 | 0.0049 | 0.0044 | 0.0050 | 0.0047 | 0.0059 | 0.0032 | 0.0048 | 0.0055 | 0.0052 |
| 608.15 | 0.0048 | 0.0043 | 0.0049 | 0.0046 | 0.0058 | 0.0031 | 0.0047 | 0.0054 | 0.0051 |
| 608.90 | 0.0047 | 0.0042 | 0.0049 | 0.0045 | 0.0058 | 0.0031 | 0.0046 | 0.0053 | 0.0050 |
| 609.64 | 0.0047 | 0.0041 | 0.0048 | 0.0044 | 0.0057 | 0.0031 | 0.0045 | 0.0052 | 0.0050 |

TABLE 27

| Wavelength | Example numbers | | | | | | | | |
|---|---|---|---|---|---|---|---|---|---|
| (nm) | 1 | 2 | 3 | 4 | 5 | 6 | 7 | 8 | 9 |
| 610.38 | 0.0046 | 0.0041 | 0.0047 | 0.0044 | 0.0056 | 0.0030 | 0.0044 | 0.0051 | 0.0049 |
| 611.13 | 0.0045 | 0.0040 | 0.0046 | 0.0043 | 0.0056 | 0.0029 | 0.0044 | 0.0050 | 0.0048 |
| 611.87 | 0.0045 | 0.0039 | 0.0045 | 0.0042 | 0.0055 | 0.0030 | 0.0043 | 0.0049 | 0.0047 |
| 612.62 | 0.0043 | 0.0038 | 0.0044 | 0.0041 | 0.0055 | 0.0029 | 0.0042 | 0.0049 | 0.0046 |
| 613.36 | 0.0043 | 0.0037 | 0.0043 | 0.0040 | 0.0054 | 0.0029 | 0.0041 | 0.0047 | 0.0046 |

TABLE 27-continued

| Wavelength (nm) | Example numbers | | | | | | | | |
|---|---|---|---|---|---|---|---|---|---|
| | 1 | 2 | 3 | 4 | 5 | 6 | 7 | 8 | 9 |
| 614.10 | 0.0042 | 0.0037 | 0.0043 | 0.0039 | 0.0054 | 0.0028 | 0.0040 | 0.0046 | 0.0045 |
| 614.85 | 0.0041 | 0.0036 | 0.0042 | 0.0039 | 0.0054 | 0.0028 | 0.0039 | 0.0046 | 0.0044 |
| 615.59 | 0.0041 | 0.0035 | 0.0042 | 0.0038 | 0.0053 | 0.0028 | 0.0039 | 0.0045 | 0.0043 |
| 616.33 | 0.0040 | 0.0034 | 0.0041 | 0.0037 | 0.0052 | 0.0027 | 0.0038 | 0.0044 | 0.0043 |
| 617.08 | 0.0039 | 0.0033 | 0.0040 | 0.0037 | 0.0051 | 0.0027 | 0.0037 | 0.0043 | 0.0042 |
| 617.82 | 0.0039 | 0.0033 | 0.0040 | 0.0036 | 0.0051 | 0.0027 | 0.0036 | 0.0042 | 0.0041 |
| 618.56 | 0.0038 | 0.0032 | 0.0039 | 0.0035 | 0.0051 | 0.0026 | 0.0036 | 0.0041 | 0.0040 |
| 619.31 | 0.0037 | 0.0032 | 0.0038 | 0.0035 | 0.0050 | 0.0026 | 0.0035 | 0.0041 | 0.0040 |
| 620.05 | 0.0037 | 0.0031 | 0.0037 | 0.0034 | 0.0050 | 0.0026 | 0.0035 | 0.0040 | 0.0039 |
| 620.79 | 0.0036 | 0.0030 | 0.0037 | 0.0033 | 0.0049 | 0.0026 | 0.0033 | 0.0040 | 0.0038 |
| 621.54 | 0.0036 | 0.0030 | 0.0036 | 0.0033 | 0.0049 | 0.0026 | 0.0033 | 0.0039 | 0.0038 |
| 622.28 | 0.0035 | 0.0029 | 0.0036 | 0.0032 | 0.0048 | 0.0025 | 0.0032 | 0.0038 | 0.0037 |
| 623.02 | 0.0035 | 0.0028 | 0.0035 | 0.0032 | 0.0048 | 0.0025 | 0.0031 | 0.0038 | 0.0037 |
| 623.76 | 0.0034 | 0.0028 | 0.0035 | 0.0032 | 0.0047 | 0.0025 | 0.0032 | 0.0036 | 0.0036 |
| 624.51 | 0.0033 | 0.0028 | 0.0034 | 0.0030 | 0.0046 | 0.0024 | 0.0031 | 0.0036 | 0.0035 |

Figure 33:
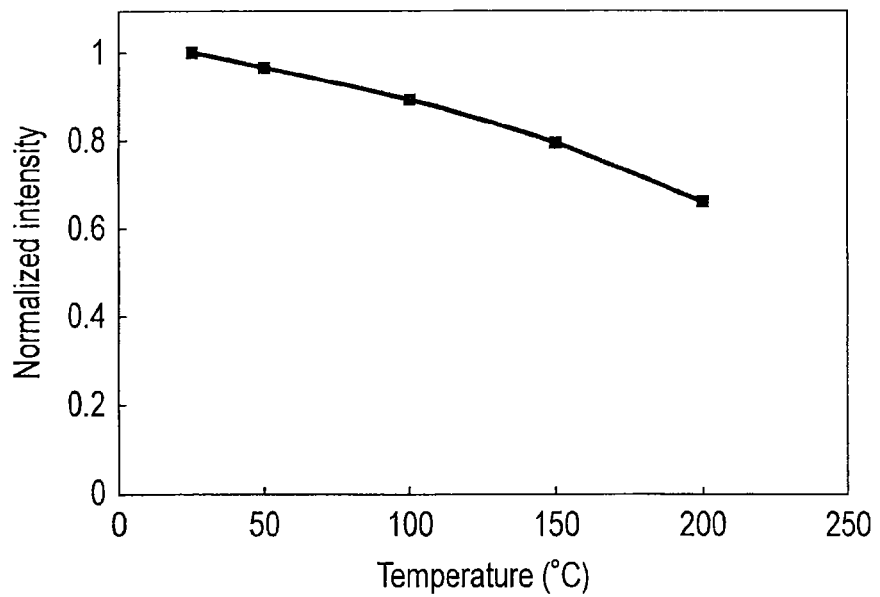
FIG. 33 is a view showing temperature characteristics of the luminescent material of Example.
Figure 34:
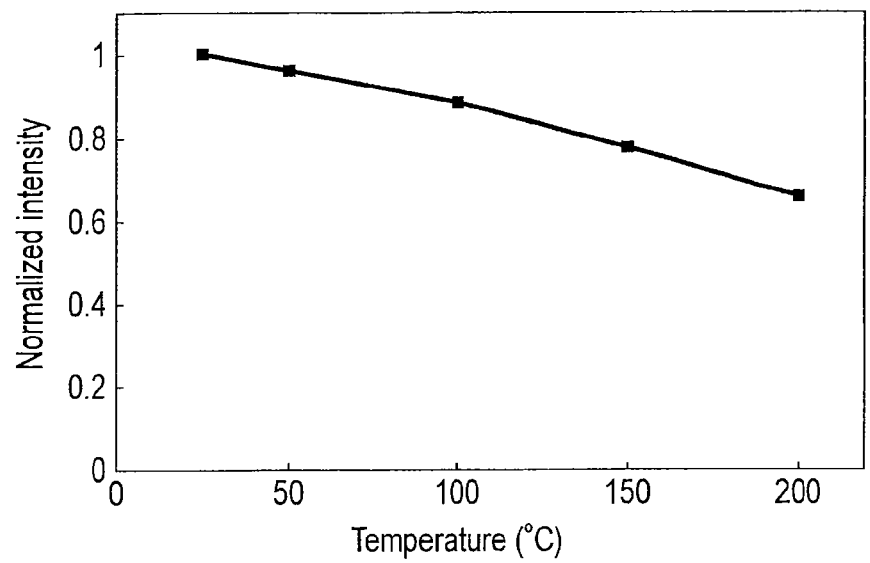
FIG. 34 is a view showing temperature characteristics of the luminescent material of Example.
Figure 35:
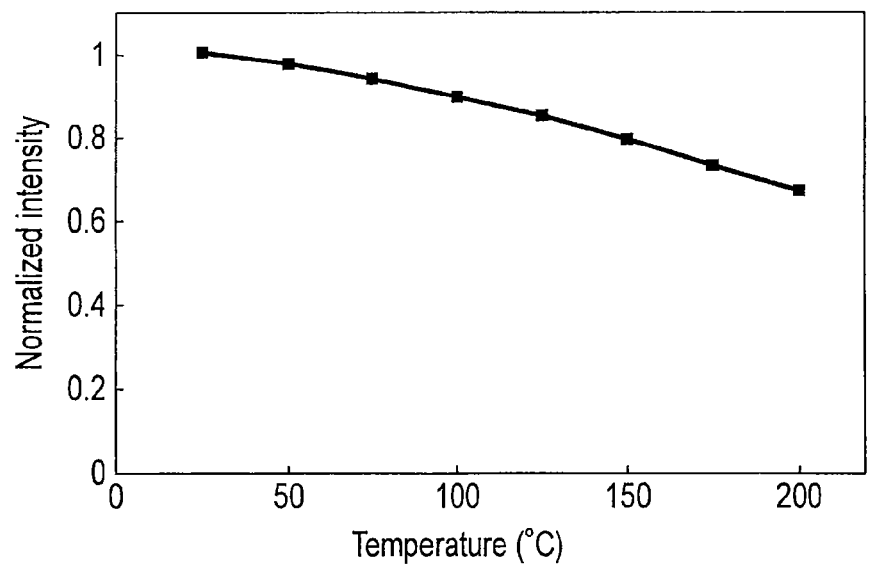
FIG. 35 is a view showing temperature characteristics of the luminescent material of Example.
Figure 36:
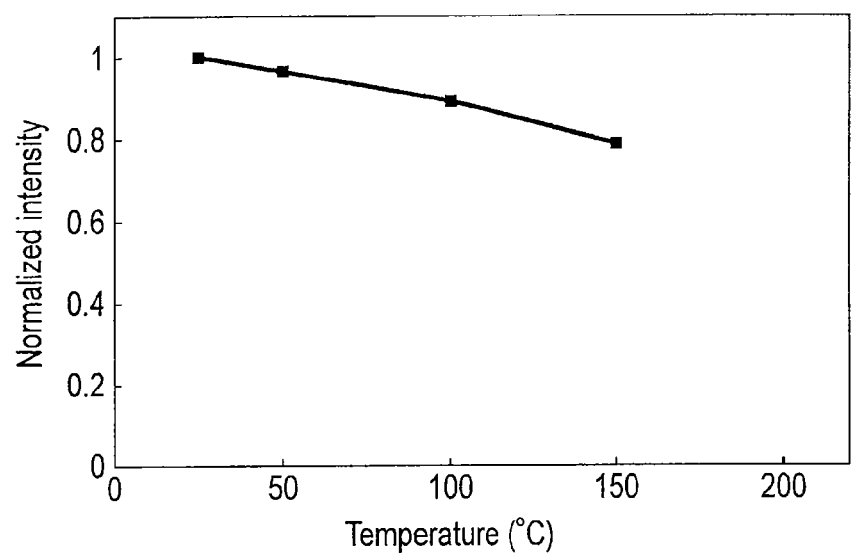
FIG. 36 is a view showing temperature characteristics of the luminescent material of Example.
Figure 37:
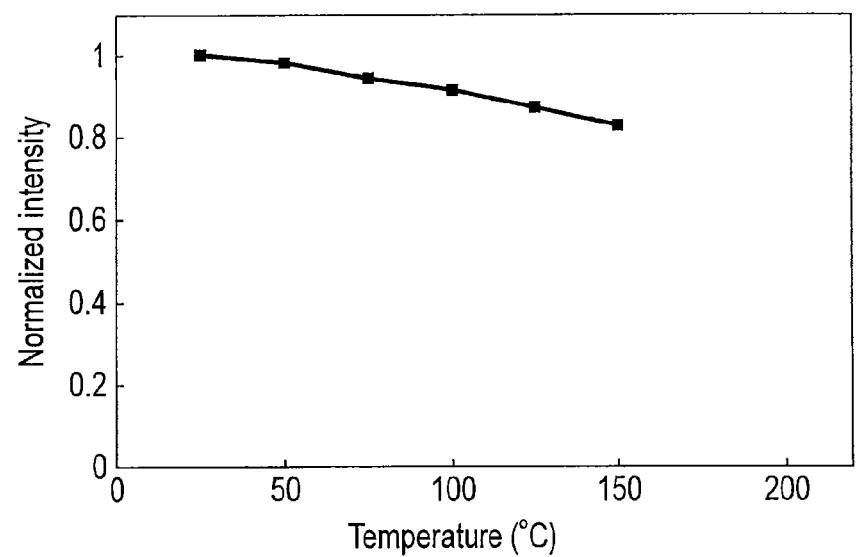
FIG. 37 is a view showing temperature characteristics of the luminescent material of Example.

FIG. 33 shows temperature characteristics of the luminescent material of Example 2. The temperature characteristics were determined in the following manner. The luminescent material was heated with a heater and the emission intensity ($I_T$) at a predetermined temperature T was determined. An instantaneous multichannel spectrometer was used to measure the emission intensity. The normalized intensity was calculated by the equation of $(I_T/I_{25}) \times 100$ using the emission intensity ($I_{25}$) at 25° C. The normalized intensity is also referred to as an intensity retention. As shown in FIG. 33, a normalized intensity of 0.8 or more was obtained at 150° C. If the normalized intensity is 0.75 or more, temperature characteristics can be determined to be good. It is found that the luminescent material of Example 2 has a small decrease in emission intensity even if the temperature is increased.

Temperature characteristics of the luminescent materials of Examples 3, 4, 5, 6, and 8 were determined in the same manner as described above. The results were shown in FIGS. 34 to 38. In any of the luminescent materials, a normalized intensity of 0.78 or more was obtained at 150° C. Similar to the luminescent material of Example 2, it is found that a decrease in emission intensity is small even if the temperature is increased.

The peak wavelength and intensity retention of the luminescent materials of the examples and the comparative examples are summarized in Tables 28 and 29 below.

TABLE 28

| Example | Peak wavelength (nm) | Intensity retention |
|---|---|---|
| 1 | 519 | 0.800 |
| 2 | 519 | 0.800 |
| 3 | 524 | 0.780 |
| 4 | 519 | 0.800 |
| 5 | 523 | 0.790 |
| 6 | 519 | 0.824 |
| 7 | 519 | 0.800 |
| 8 | 521 | 0.780 |
| 9 | 521 | 0.774 |

TABLE 29

| Comparative Example | Peak wavelength (nm) | Intensity Retention |
|---|---|---|
| 1 | 515 | 0.750 |
| 2 | 516 | 0.74 |

TABLE 29-continued

| Comparative Example | Peak wavelength (nm) | Intensity Retention |
|---|---|---|
| 3 | 510 | 0.820 |
| 4 | 518 | 0.811 |

FIG. 39 shows a relationship between the peak wavelength and the intensity retention as to the luminescent materials with different Si/Al ratios. In FIG. 39, a, b, c, and d show the results of the luminescent materials having the following Si/Al ratios.

a: Si/Al=14/2
b: Si/Al=14.25/1.75
c: Si/Al=14.5/1.5
d: Si/Al=15/1

In each case, when the peak wavelength becomes longer, the intensity retention tends to decrease. However, when the Si/Al ratio becomes higher, the intensity retention becomes a higher value. Accordingly, it is found that more excellent temperature characteristics are obtained.

While certain embodiments have been described, these embodiments have been presented by way of example only, and are not intended to limit the scope of the inventions. Indeed, the novel embodiments described herein may be embodied in a variety of forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A luminescent material which exhibits an luminescence peak in a wavelength ranging from 490 to 580 nm when excited with light having an emission peak in a wavelength ranging from 250 to 500 nm and has a composition represented by Formula 1 below, $$(M_{1-x}Eu_x)_{3-y}Al_{3+z}Si_{13-z}O_{2+u}N_{21-w}$$  Formula 1 wherein M represents Sr and a part of the Sr may be substituted by at least one selected from Ba, Ca, Mg and Na; x, y, z, u, and u–w satisfy following conditions: $0 < x \leq 1$, $-0.1 \leq y \leq 0.3$, $-3 \leq z \leq -0.52$ $-1.5 \leq u \leq -0.3$, and $-3 < u-w \leq 1$, the luminescent material having a diffraction peak intensity ($I_{31}$) of the largest peak detected at $2\theta=30.1$-$31.1°$ that is higher than a diffraction peak intensity ($I_{26}$) of the peak detected at $2\theta=25.0\text{-}26.0°$ in X-ray diffraction by the Bragg-Brendano method using Cu-Kα line.

2. The luminescent material according to claim 1, wherein x is $0.001 \leq x \leq 0.5$.

3. The luminescent material according to claim 1, wherein y is $0 \leq y \leq 0.25$.

4. The luminescent material according to claim 1, wherein z is $-2 \leq z \leq -0.52$.

5. The luminescent material according to claim 1, wherein u is $-1 \leq u \leq -0.3$.

6. The luminescent material according to claim 1, wherein u-w is $-2 \leq u-w \leq 0$.

7. The luminescent material according to claim 1, wherein the luminescent material comprises a particle having a diameter of 5 to 61 μm.

8. The luminescent material according to claim 7, wherein the particle has a diameter of 50 μm or less.

9. The luminescent material according to claim 8, wherein the diameter is 40 μm or less.

10. The luminescent material according to claim 1, wherein the luminescent material comprises a particle having an aspect ratio of 1 to 7.5.

11. The luminescent material according to claim 10, wherein the aspect ratio is 2 to 7.

12. The luminescent material according to claim 11, wherein the aspect ratio is 2 to 6.0.

13. The luminescent material according to claim 1, wherein the luminescent material has at least ten peaks at diffraction angles ($2\theta$) of 21.3-21.5°, 21.6-22.0°, 25.0-26.0°, 28.7-29.1°, 29.4-29.8°, 30.1-30.7°, 30.8-31.1°, 31.8-32.1°, 34.0-34.5°, 37.0-37.3°, 37.3-37.6°, 43.5-43.9°, 45.6-46.1°, 48.9-49.4°, 55.7-56.3°, 59.3-59.8°, and 62.8-63.2° in X-ray diffraction by the Bragg-Brendano method using Cu-Kα line.

14. The luminescent material according to claim 1, wherein a ratio of the $I_{31}$ to $I_{26}$ ($I_{31}/I_{26}$) is 1.1 to 8.

15. The luminescent material according to claim 14, wherein the ratio $I_{31}/I_{26}$ is 3 to 8.

16. A light-emitting device comprising:
a light-emitting element which emits light having an emission peak in a wavelength ranging from 250 to 500 nm; and
a luminous layer comprising a luminescent material which emits light by receiving light from the light-emitting element; the luminescent material which emits light comprising the luminescent material of claim 1.

17. The light-emitting device according to claim 16, further comprising a heat-dissipative insulation substrate on which the light-emitting element is placed.

18. The light-emitting device according to claim 16, further comprising a luminous layer comprising a red-emitting luminescent material.

19. The light-emitting device according to claim 16, wherein the light-emitting element emits light having a wavelength of 250 to 430 nm.

20. The light-emitting device according to claim 19, further comprising a luminous layer comprising a red-emitting luminescent material, and a luminous layer comprising a blue-emitting luminescent material.

* * * * *